United States Patent
Lim et al.

(10) Patent No.: US 7,091,102 B2
(45) Date of Patent: Aug. 15, 2006

(54) METHODS OF FORMING INTEGRATED CIRCUIT DEVICES HAVING A CAPACITOR WITH A HYDROGEN BARRIER SPACER ON A SIDEWALL THEREOF AND INTEGRATED CIRCUIT DEVICES FORMED THEREBY

(75) Inventors: Han-jin Lim, Seoul (KR); Kwang-hee Lee, Seoul (KR); Suk-jin Chung, Kyungki-do (KR); Cha-young Yoo, Kyungki-do (KR); Wan-don Kim, Kyungki-o (KR); Jin-il Lee, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 84 days.

(21) Appl. No.: 10/742,727

(22) Filed: Dec. 19, 2003

(65) Prior Publication Data

US 2004/0185634 A1    Sep. 23, 2004

(30) Foreign Application Priority Data

Dec. 20, 2002  (KR) ............... 10-2002-0081739
Jun. 20, 2003  (KR) ............... 10-2003-0040086

(51) Int. Cl.
*H01L 21/20*     (2006.01)
*H01L 27/108*    (2006.01)

(52) U.S. Cl. ............ 438/399; 438/239; 438/396; 257/297; 257/E21.008

(58) Field of Classification Search ............... 438/239, 438/241, 396, 399, 778; 257/297, E21.008
See application file for complete search history.

(56) References Cited

U.S. PATENT DOCUMENTS 6,485,988 B1 *  11/2002  Ma et al. ................. 438/3
6,686,620 B1 *  2/2004   An et al. ................ 257/301
6,750,492 B1 *  6/2004   Mikawa et al. .......... 257/295

FOREIGN PATENT DOCUMENTS

| JP | 2002-280528 | * | 9/2002 |
| KR | 10-2001-011157 | | 2/2001 |
| KR | 10-2001-0029846 | | 4/2001 |
| KR | 10200020013154 | | 2/2002 |
| KR | 1020030057673 A | | 7/2003 |
| WO | WO 98/31053 | | 4/1998 |

OTHER PUBLICATIONS

Notice to Submit a Response for Korean Patent Application No. 10-2003-004086 mailed on Mar. 31, 2005.
Notice to Submit a Response for Korean Patent Application No. 10-2003-0040086 mailed on Sep. 30, 2005.

* cited by examiner

*Primary Examiner*—Zandra V. Smith
*Assistant Examiner*—Pamela E Perkins
(74) *Attorney, Agent, or Firm*—Myers Bigel Sibley & Sajovec, P.A.

(57) ABSTRACT

An integrated circuit device is formed by providing a substrate and forming a capacitor on the substrate. The capacitor includes a lower electrode disposed on the substrate, a dielectric layer on the lower electrode, and an upper electrode on the dielectric. A hydrogen barrier insulation layer is formed on the upper electrode and a hydrogen barrier spacer is formed on a sidewall of the capacitor.

63 Claims, 17 Drawing Sheets

US 7,091,102 B2

METHODS OF FORMING INTEGRATED CIRCUIT DEVICES HAVING A CAPACITOR WITH A HYDROGEN BARRIER SPACER ON A SIDEWALL THEREOF AND INTEGRATED CIRCUIT DEVICES FORMED THEREBY

RELATED APPLICATION

This application claims the benefit of Korean Patent Application No. 2002-81739, filed Dec. 20, 2002 and Korean Patent Application No. 2003-40086, filed Jun. 20, 2003, the disclosures of which are hereby incorporated herein by reference.

FIELD OF THE INVENTION

The present invention relates generally to methods of forming integrated circuit devices and integrated circuit devices formed thereby and, more particularly, to methods of forming integrated circuit capacitors and integrated circuit capacitors formed thereby.

BACKGROUND OF THE INVENTION

As the integration density of integrated circuit memory devices has increased, research into materials that have a high dielectric constant, such as $Ta_2O_5$, BST, and PZT, for use as a dielectric layer in an integrated circuit memory device capacitor has increased. Conventionally, polysilicon has been used as a storage node and a plate node of a capacitor. However, a high dielectric constant layer typically interacts with polysilicon, such that oxygen atoms in the dielectric layer penetrate into the polysilicon, which may degrade electrical properties of the capacitor. Also, when an electrode comprises polysilicon, leakage current may increase due to polysilicon's small work function. For this reason, extensive studies have been made in which a noble metal, such as Ru and Pt, is used in place of polysilicon as a capacitor electrode of an integrated circuit memory device.

Forming a memory device, such as a DRAM, that has a capacitor electrode that comprises a noble metal typically involves a hydrogen alloy process. Memory device capacitors that include an electrode that comprises a noble metal, such as, for example, metal-insulator-metal (MIM) capacitors and/or a metal-insulator-silicon (MIS) capacitors, a catalytic action of the noble metal may allow hydrogen ions to penetrate into the dielectric layer of the capacitor. The hydrogen penetrates into the dielectric layer and may degrade electrical properties of an interface between electrodes and the dielectric layer of the capacitor.

Aluminum oxide ($Al_2O_3$) may be deposited on a capacitor as a hydrogen barrier layer to inhibit penetration of hydrogen into the dielectric layer as is disclosed in U.S. Patent Publication No. 2002/0074588 entitled "Ferroelectric Capacitors for Integrated Circuit Memory Devices and Methods of Manufacturing the Same," published in Jun. 20, 2002, by inventor Kyu-Mann Lee. The technique of depositing aluminum oxide on a capacitor as a hydrogen barrier layer may, however, cause contact resistance to increase during a subsequent etching process for forming a metal contact hole.

FIGS. 1 and 2 are cross-sectional views that illustrate a method of forming a conventional capacitor that includes electrodes that comprise a noble metal. Referring to FIG. 1, a transistor (not shown) and a bit line 14 are formed on a semiconductor substrate 10, and then a first interlayer dielectric (ILD) layer 12 is deposited thereon and planarized. An etch stop layer 16 is formed, and a lower electrode 18, a dielectric layer 20, and an upper electrode 22 are sequentially deposited thereon to form a capacitor 24. After this, an aluminum oxide layer 26 is deposited using a blanket method to prevent penetration of hydrogen into the dielectric layer 20 during a subsequent hydrogen alloy process.

Referring to FIG. 2, a second ILD layer 28 is thickly formed on the surface of the semiconductor substrate where the aluminum oxide layer 26 is deposited as the hydrogen barrier layer. A photoresist layer is coated on the second ILD layer 28 and then a metal contact hole 30 for connecting a bit line 14 and a metal line is formed using photolithographic and etching processes. The etching process for forming the metal contact hole may be a dry etching process. If the aluminum oxide layer 26 for the hydrogen barrier layer is exposed during the etching process for forming the contact hole 30, then the contact hole 30 may be incorrectly formed (A). As a result, the contact hole 30 may be obliquely formed or incompletely made (A). When a poorly formed contact hole is filled with a conductive material for a contact plug a contact resistance may increase in the metal contact region, thereby degrading electrical properties of an integrated circuit device incorporating the capacitor.

FIG. 3 is a cross-sectional view that illustrates another method of forming a conventional capacitor that includes electrodes that comprise a noble metal. Referring to FIG. 3, an aluminum oxide layer 26a that is used as a hydrogen barrier layer does not extend to a metal contact region to avoid increasing the contact resistance at a metal contact region. A capacitor 24 is formed and the aluminum oxide layer 26a for the hydrogen barrier layer is deposited on a capacitor upper electrode 22. The capacitor 24 and the aluminum oxide layer 26a comprising the hydrogen barrier layer are etched together. Thus, the increase in a contact resistance in a contact hole 30 caused by oblique etching or incomplete etching can be avoided. Because a sidewall of the capacitor is exposed during a hydrogen alloy process, however, hydrogen may penetrate into a dielectric layer 20 and degrade electrical properties of an integrated circuit device that incorporates the capacitor.

FIG. 4 is a graph of leakage current versus voltage for a capacitor formed using the method described above with reference to FIG. 3. The x-axis represents a voltage (V) applied to a semiconductor device including a capacitor, and the y-axis represents a leakage current per a unit cell (A/cell). In the drawing, the solid line denotes a leakage current characteristic before a hydrogen alloy process is performed. The line illustrated as -●- denotes a leakage current characteristic after the aluminum oxide layer for the hydrogen barrier layer is deposited to a thickness of 150 Å. As can be seen from FIG. 4, the leakage current increased even with use of the aluminum oxide layer for the hydrogen barrier layer. It may be presumed that hydrogen penetrated into sidewalls of the capacitor and degraded characteristics of an electrode interface or a dielectric layer, thus increasing the leakage current.

According to conventional methods of forming a capacitor that includes electrodes comprising a noble metal, a contact resistance may increase in a metal contact hole or hydrogen may penetrate into sidewalls of the capacitor, thus degrading characteristics of electrodes and/or a dielectric layer of the capacitor. As a result, a leakage current may increase.

SUMMARY OF THE INVENTION

According to embodiments of the present invention, an integrated circuit device is formed by providing a substrate and forming a capacitor on the substrate. The capacitor comprises a lower electrode disposed on the substrate, a dielectric layer on the lower electrode, and an upper electrode on the dielectric. A hydrogen barrier insulation layer is formed on the upper electrode and a hydrogen barrier spacer is formed on a sidewall of the capacitor.

In other embodiments of the present invention, the hydrogen barrier insulation layer is formed by forming the hydrogen barrier insulation layer on the upper electrode and on the substrate. The hydrogen barrier insulation layer is etched so as to substantially remove the hydrogen barrier insulation layer from the substrate.

In still other embodiments of the present invention, the hydrogen barrier insulation layer is a first hydrogen barrier insulation layer and forming the hydrogen barrier spacer comprises forming a second. hydrogen barrier insulation layer on the first hydrogen barrier insulation layer and on the substrate. The second hydrogen barrier insulation layer is etched so as to form the hydrogen barrier spacer on the sidewall of the capacitor.

In still other embodiments of the present invention, the first hydrogen barrier insulation layer comprises aluminum oxide, titanium oxide, tantalum oxide, titanium nitride, silicon oxide, and/or silicon without impurities and the second hydrogen barrier insulation layer comprises aluminum oxide, titanium oxide, tantalum oxide, titanium nitride, silicon oxide, and/or silicon without impurities.

In still other embodiments of the present invention, the first hydrogen barrier insulation layer has a thickness of about 200–1000 Å and the second hydrogen barrier insulation layer has a thickness of about 100–500 Å.

In still other embodiments of the present invention, the first and second hydrogen barrier insulation layers are formed using one of atomic layer deposition (ALD) and chemical vapor deposition (CVD).

In further embodiments of the present invention, the hydrogen barrier insulation layer is a first hydrogen barrier insulation layer and forming the hydrogen barrier spacer comprises forming a liner layer on the first hydrogen barrier insulation layer and oil the substrate. A second hydrogen barrier insulation layer is formed on the liner layer. The second hydrogen barrier insulation layer and the liner layer are etched so as to form the hydrogen barrier spacer on the sidewall of the capacitor. The hydrogen barrier spacer comprises a second hydrogen barrier insulation layer spacer on a liner layer spacer.

In still further embodiments of the present invention, the liner layer comprises silicon nitride, silicon oxide, silicon carbide, tantalum oxide, and/or titanium oxide and is formed to a thickness of about 50–100 Å.

In other embodiments of the present invention, forming the hydrogen barrier insulation layer comprises forming the hydrogen barrier insulation layer on the upper electrode and on the substrate. An etch stop layer is formed on the hydrogen barrier insulation layer. The etch stop layer and the hydrogen barrier insulation layer are etched so as to substantially remove the etch stop layer and the hydrogen barrier insulation layer from the substrate.

In still other embodiments of the present invention, the hydrogen barrier insulation layer is a first hydrogen barrier insulation layer and forming the hydrogen barrier spacer comprises forming a second hydrogen barrier insulation layer on the etch stop layer and on the substrate. The second hydrogen barrier insulation layer is etched so as to form the hydrogen barrier spacer on the sidewall of the capacitor.

In still other embodiments of the present invention, the etch stop layer comprises a P-TEOS layer.

In some embodiments of the present invention, the capacitor is a stack-type capacitor. In other embodiments of the present invention, the capacitor is a cylinder-type capacitor.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
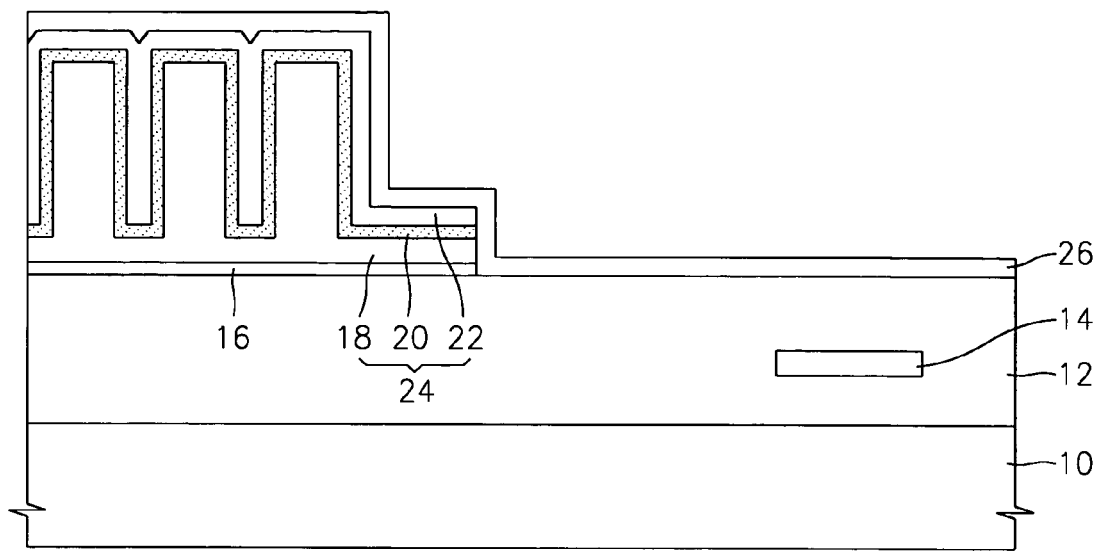
FIGS. 1 and 2 are cross-sectional views that illustrate a method of forming a conventional capacitor that includes electrodes that comprise a noble metal.
Figure 2:
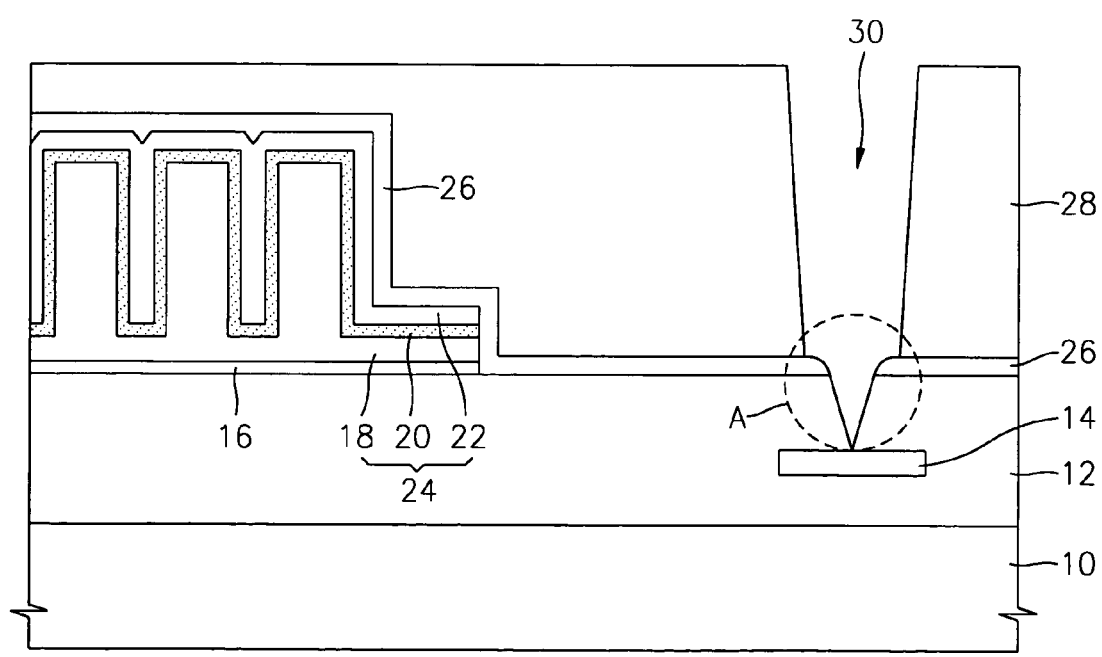
Figure 3:
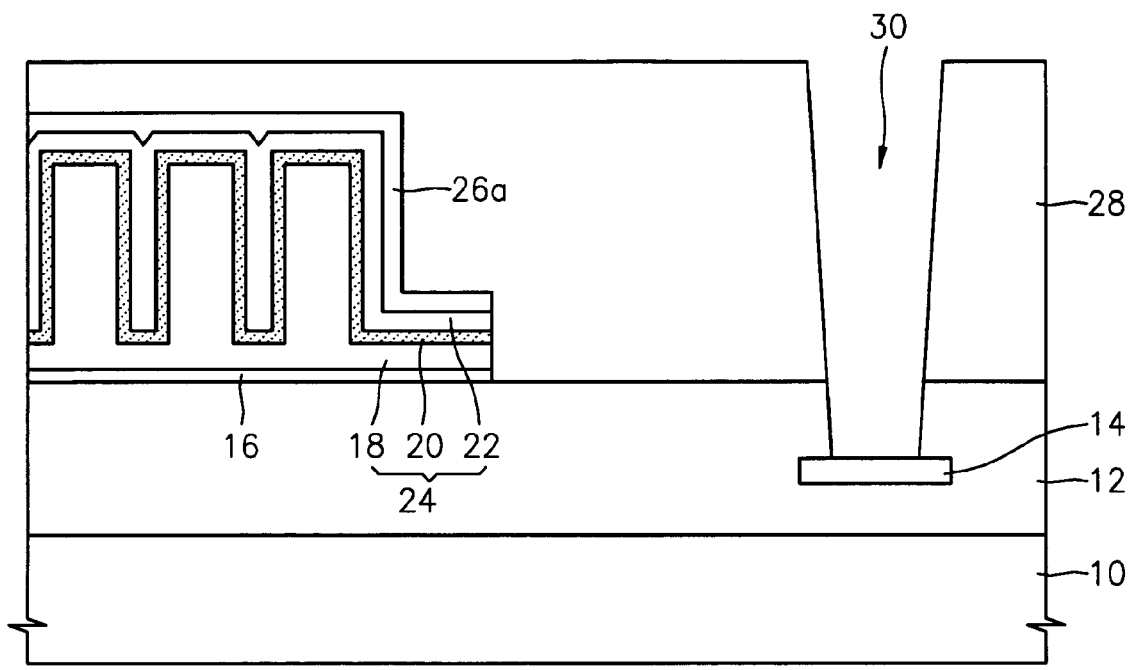
FIG. 3 is a cross-sectional view that illustrates another method of forming a conventional capacitor that includes electrodes that comprise a noble metal.
Figure 4:
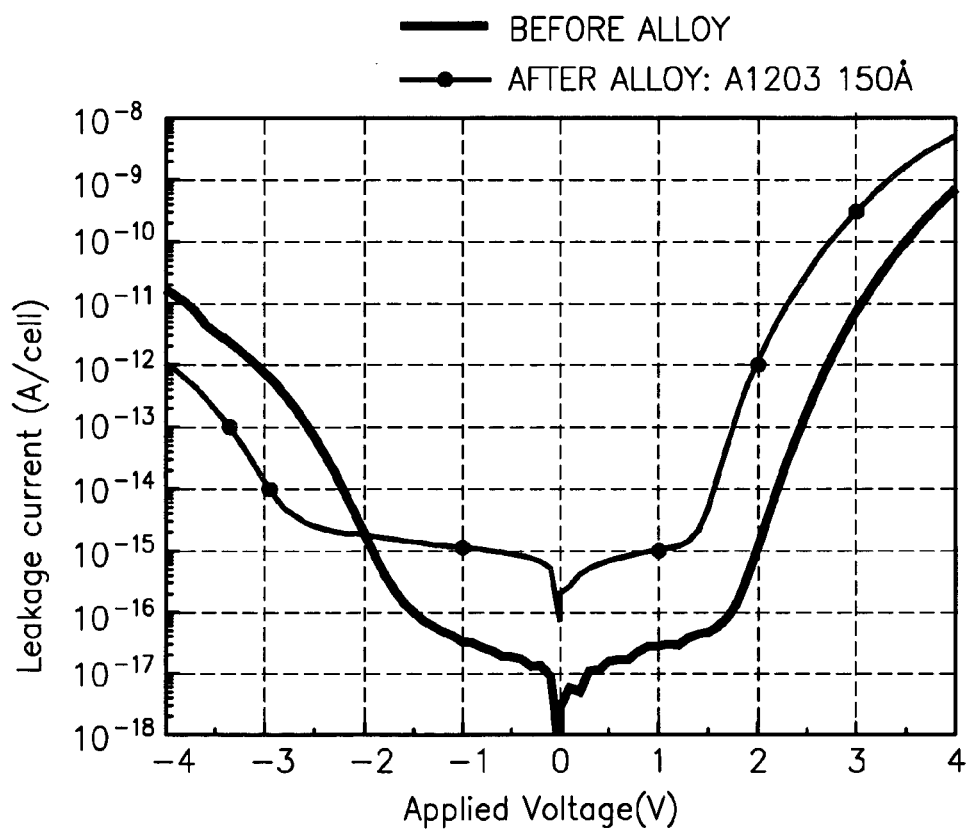
FIG. 4 is a graph of leakage current versus voltage for a capacitor formed using the method of FIG. 3.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

FIGS. 5 through 8 are cross-sectional views that illustrate methods of forming a stack-type capacitor of an integrated circuit device that includes a hydrogen barrier spacer according to some embodiments of the present invention. FIGS. 9 through 12 are cross-sectional views that illustrate methods of forming a cylinder-type capacitor of an integrated circuit device that includes a hydrogen barrier spacer according to some embodiments of the present invention.

Figure 5:
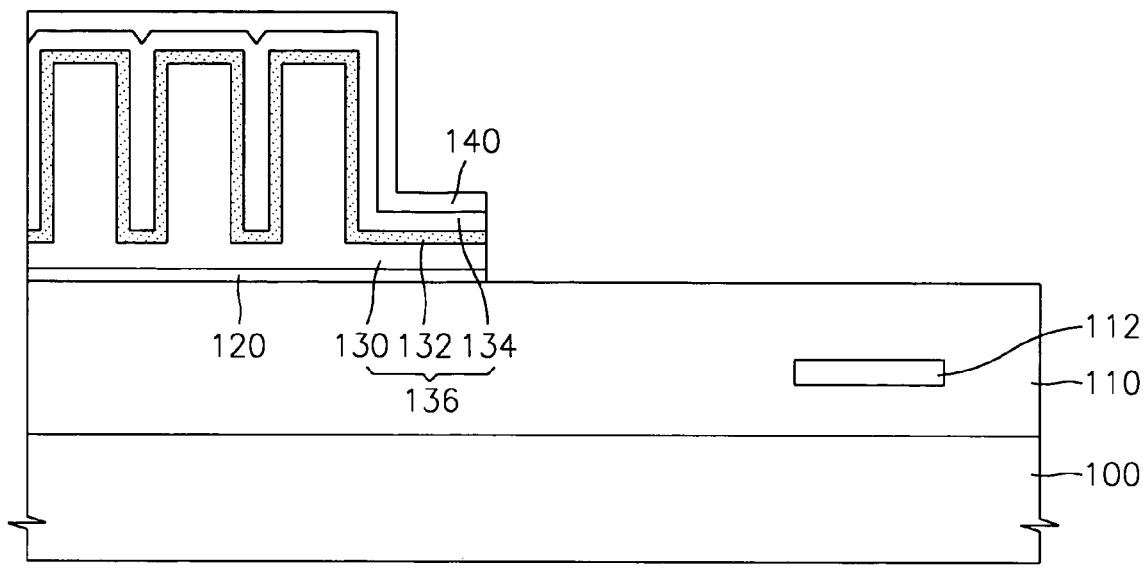
FIGS. 5 through 8 are cross-sectional views that illustrate methods of forming a stack-type capacitor of an integrated circuit device that includes a hydrogen barrier spacer according to some embodiments of the present invention.
Figure 9:
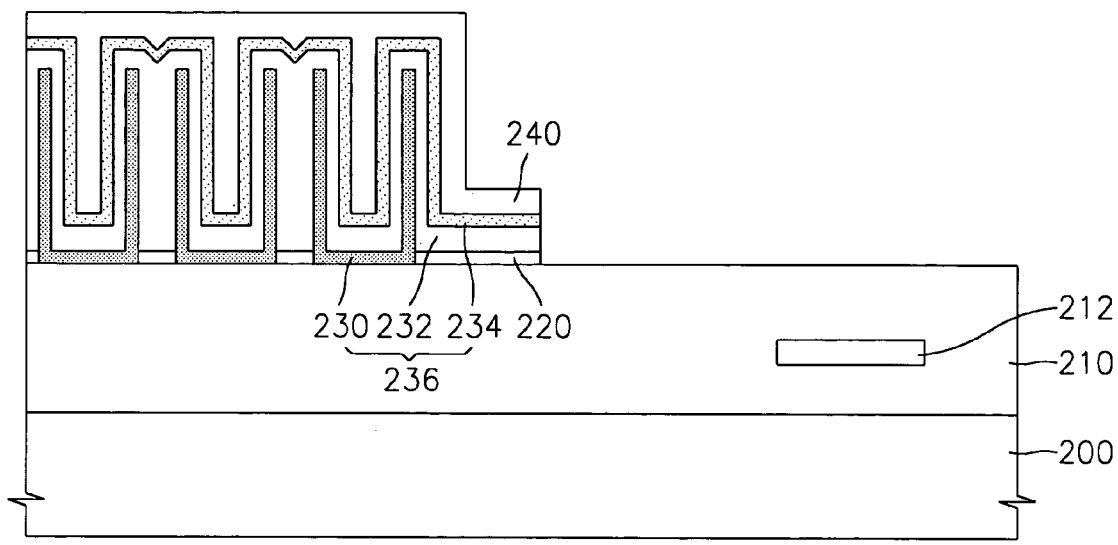
FIGS. 9 through 12 are cross-sectional views that illustrate methods of forming a cylinder-type capacitor of an integrated circuit device that includes a hydrogen barrier spacer according to some embodiments of the present invention.

Referring to FIGS. 5 and 9, lower structures including bit lines 112 and 212 and transistors may be formed on semiconductor substrates 100 and 200 by conventional methods. First ILD layers 110 and 210, which may comprise an oxide, are deposited on the lower structures and are then planarized. Etch stop layers 120 and 220, which may comprise a nitride, are formed on the first ILD layers 110 and 210, for example. Next, capacitors 136 and 236, which comprise lower electrodes 130 and 230, dielectric layers 132 and 232, and upper electrodes 134 and 234 are formed on the etch stop layers 120 and 220. The capacitor 136 and the capacitor 236 may be a stack-type capacitor and a cylinder-type capacitor, respectively.

A capacitor in accordance with some embodiments of the present invention has a capacitor-on-bit line (COB) structure. Various integrated circuit memory devices may incorporate a COB capacitor, such as a ferroelectric random access memory (FRAM), a dynamic random access memory (DRAM), and the like. The lower electrodes 130 and 230 and the upper electrodes 134 and 234 of the capacitors 136 and 236 may comprise one or more of the following noble metals, such as ruthenium, iridium, platinum, rhodium, and osmium. The dielectric layers 132 and 232 may comprise $Ta_2O_5$.

First hydrogen-barrier insulating layers 140 and 240 are deposited on the capacitors 136 and 236 to a thickness of about 200 Å to 1000 Å. The first hydrogen-barrier insulating layers 140 and 240 may comprise aluminum oxide ($Al_2O_3$), titanium oxide ($TiO_2$), tantalum oxide ($Ta_2O_5$), titanium nitride (TiN), silicon oxide ($SiO_2$), and/or silicon without impurities. In some embodiments of the present invention, the first hydrogen-barrier insulating layers 140 and 240 comprise aluminum oxide ($Al_2O_3$).

A photoresist layer is coated on the first hydrogen-barrier insulating layers 140 and 240, and then the first hydrogen-barrier insulating layers 140 and 240 and the capacitors 136 and 236 are simultaneously etched using photolithographic and etching processes. A cell region is separated from a peripheral region by the etching process.

Figure 6:
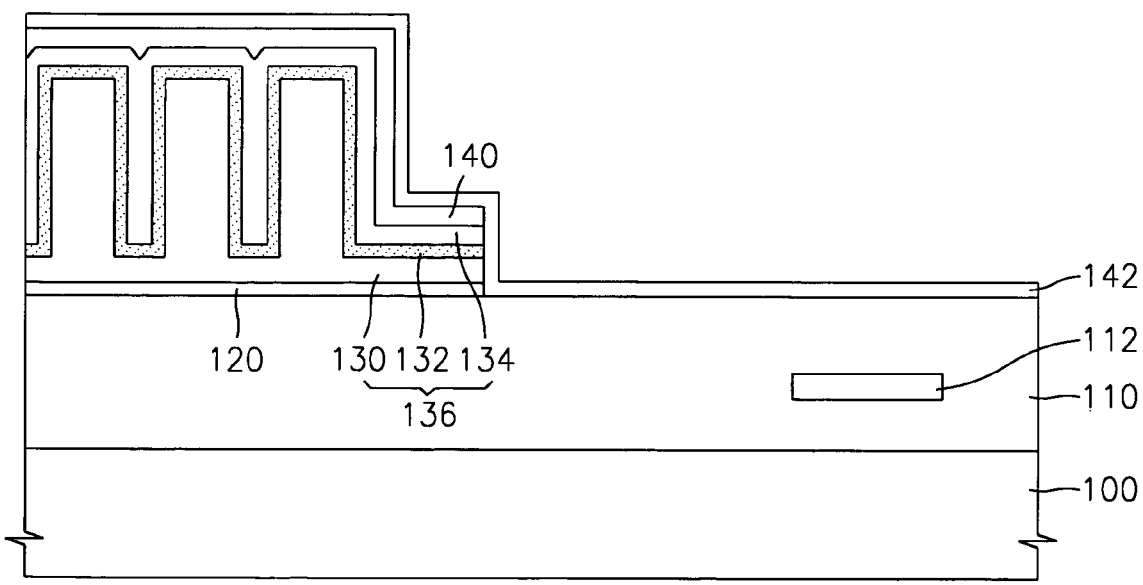
Figure 10:
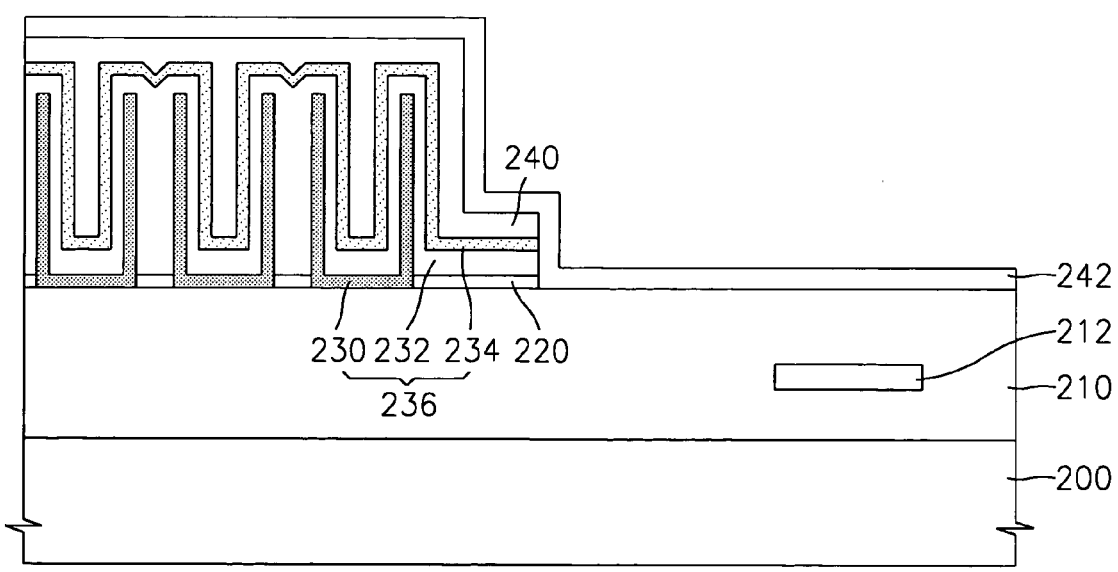

Referring to FIGS. 6 and 10, second hydrogen-barrier layers 142 and 242 are deposited using a blanket method on the semiconductor substrate where the etching process for separating the cell region from the peripheral region is completed. The second hydrogen-barrier layers 142 and 242 may be formed to a thickness of 100 Å to 500 Å. The second hydrogen-barrier insulating layers 142 and 242 may comprise aluminum oxide ($Al_2O_3$), titanium oxide ($TiO_2$), tantalum oxide ($Ta_2O_5$), titanium nitride (TiN), silicon oxide ($SiO_2$), and/or silicon without impurities. In some embodiments of the present invention, the second hydrogen-barrier insulating layers 142 and 242 comprise aluminum oxide ($Al_2O_3$).

The first hydrogen-barrier insulating layers 140 and 240 and the second hydrogen-barrier insulating layers 142 and 242 may be deposited using atomic layer deposition (ALD) or chemical vapor deposition (CVD). In some embodiments of the present invention, the first and second hydrogen-barrier insulating layers 140, 240, 142, and 242 are formed using ALD. The first and second hydrogen-barrier insulating layers 140, 240 142, and 242 may be used to inhibit penetration of hydrogen into the capacitors 136 and 236 during a hydrogen alloy process.

Figure 7:
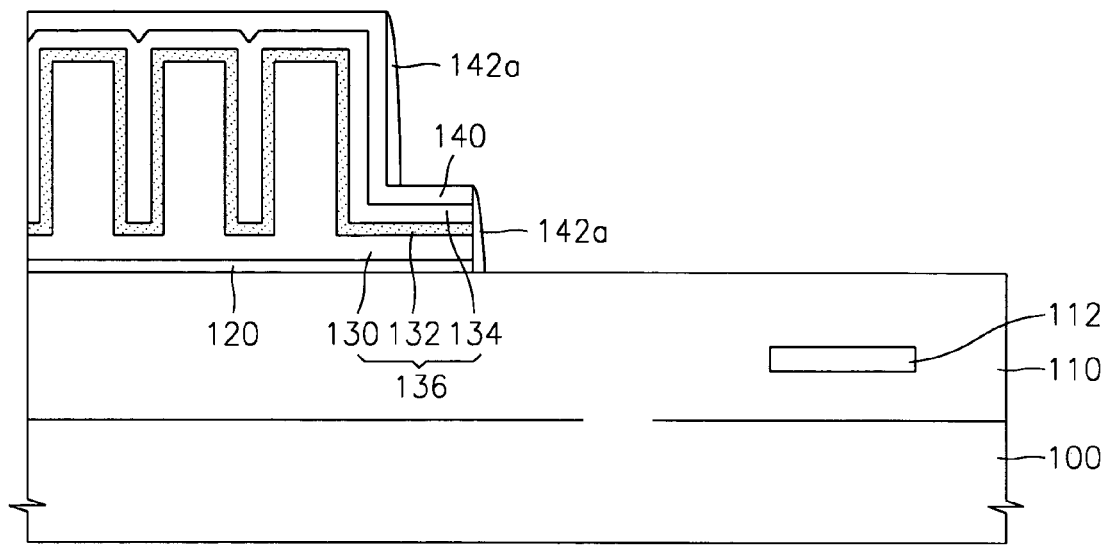
Figure 11:
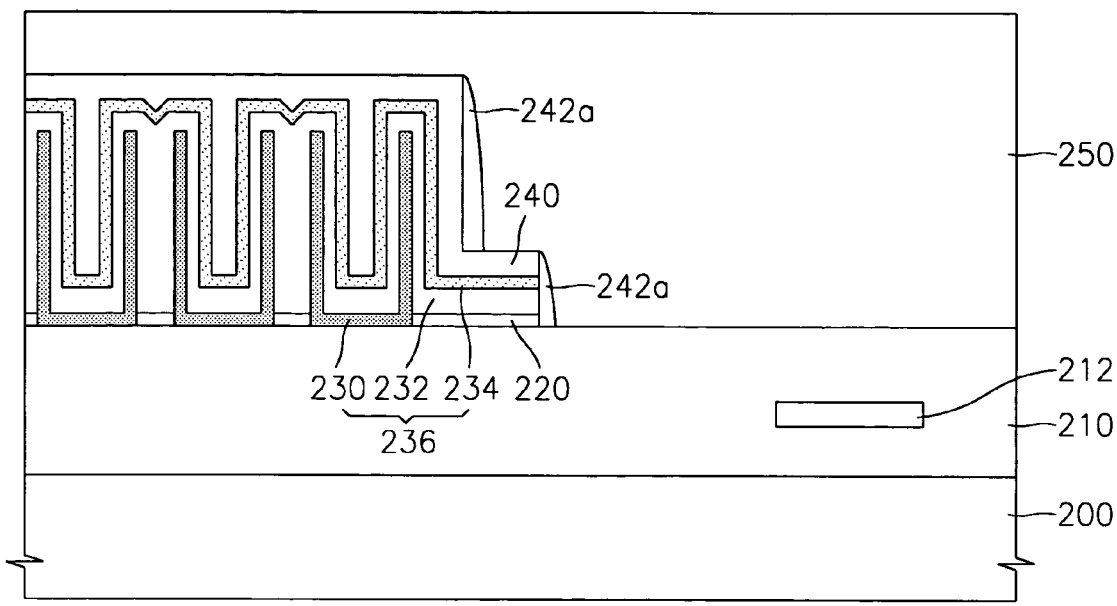

Referring to FIGS. 7 and 11, the second hydrogen-barrier insulating layers 142 and 242 are etched using an anisotropic etch process. Thus, hydrogen barrier spacers 142a and 242a are formed on sidewalls of portions where a step exists between the cell region and the peripheral region, i.e., sidewalls of the etched capacitors 136 and 236. Accordingly, the tops and the sidewalls of the capacitors 136 and 236 are capped twice by the first hydrogen-barrier insulating layers 140 and 240 and the hydrogen barrier spacers 142a and 242a.

A dry etching process may be performing to form the hydrogen barrier spacers 142a and 242a so that the thickness of the first hydrogen-barrier insulating layers 140 and 240 is about 100 Å or thicker. Also, the first hydrogen-barrier layers 140 and 240 are not formed at the peripheral region where the bit lines 112 and 212 are formed. When a metal contact hole is etched during a subsequent process, an increase in contact resistance, caused by oblique etching and/or incomplete etching, may be avoided.

Next, an additional process for curing damage caused by etching is performed on the semiconductor substrate where the hydrogen barrier spacers 142a and 242a are formed. The etching damage may occur during the formation of the hydrogen barrier spacers 142a and 242a. The curing process may involve plasma processing using $O_2$, $NH_3$, and/or $N_2O$ or a thermal treatment using $O_2$, $N_2$, and/or $O_3$.

The plasma processing using $O_2$ may be carried out under the following conditions in accordance with some embodiments of the present invention. A chamber of semiconductor manufacturing equipment is maintained at a temperature of about 300° C. to 500° C. and under a pressure of about 1 Torr to 5 Torr. A plasma power supply ranges from about 500 W to 2000 W, and oxygen ($O_2$) may be injected into the chamber at a flow rate of about 1500 sccm to 3000 sccm. Also, the $O_2$-plasma processing may be carried out for about 30 seconds to 3 minutes.

Figure 8:
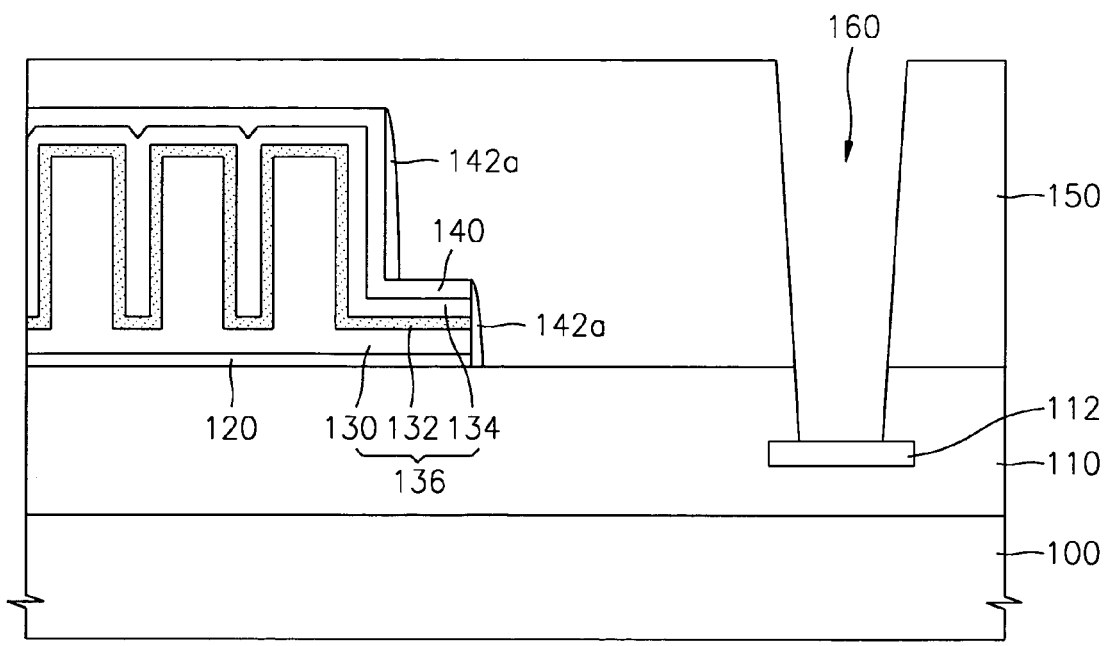
Figure 12:
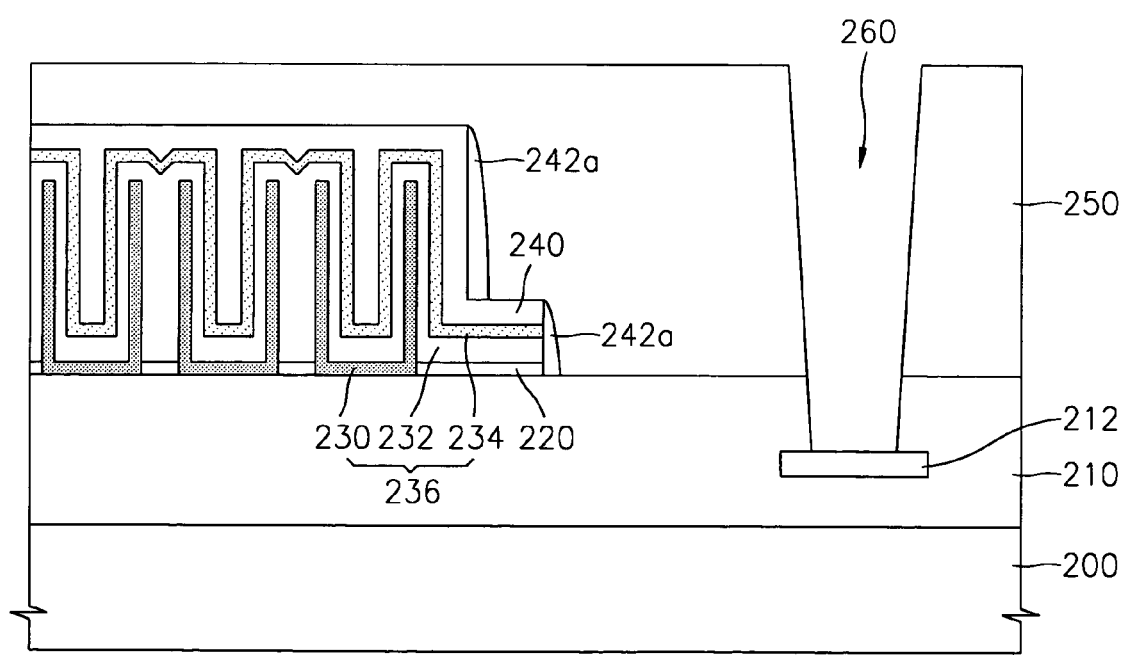

Referring to FIGS. 8 and 12, second ILD layers 150 and 250 are deposited to a sufficient thickness on the semiconductor substrate where the hydrogen barrier spacers 142a and 242a are formed to remove a step between the cell region and the peripheral region. The second ILDs 150 and 250 are planarized using, for example, an etchback process or a chemical mechanical polishing (CMP) process. Next, the second ILDs 150 and 250 are coated with a photoresist layer, which is then planarized. Photolithographic and etching processes are carried out to form metal contact holes 160 and 260. In the peripheral region, because the first hydrogen-barrier insulating layers 140 and 240 are not disposed on the first ILDs 110 and 210, an increase in contact resistance, caused by oblique etching and/or incomplete etching, may be avoided when forming the metal contact holes 160 and 260.

In addition, even if a hydrogen alloy process is carried out to improve electrical properties of the transistor, electrodes of the noble-metal capacitors 136 and 236 are capped twice by the first hydrogen-barrier insulating layers 140 and 240 and the hydrogen barrier spacers 142a and 242a. As a result, the electrical properties may not degrade at the interface between the electrodes and the dielectric layer.

Therefore, according to some embodiments of the present invention, the hydrogen barrier spacers 142a and 242a are formed to cover the sidewalls of the capacitor, and an additional process for curing the damage that may be caused by etching is carried out so as to inhibit the penetration of hydrogen into the capacitor electrode. Thus, the surfaces of upper and lower electrodes of the capacitor can be protected from degradation, and electrical properties of the dielectric layer may be maintained.

FIGS. 13 through 16 are cross-sectional views that illustrate methods of forming a stack-type capacitor of an integrated circuit device that includes a hydrogen barrier spacer according to further embodiments of the present invention. FIGS. 17 through 20 are cross-sectional views that illustrate methods of forming a cylinder-type capacitor of an integrated circuit device that includes a hydrogen barrier spacer according to further embodiments of the present invention.

Figure 13:
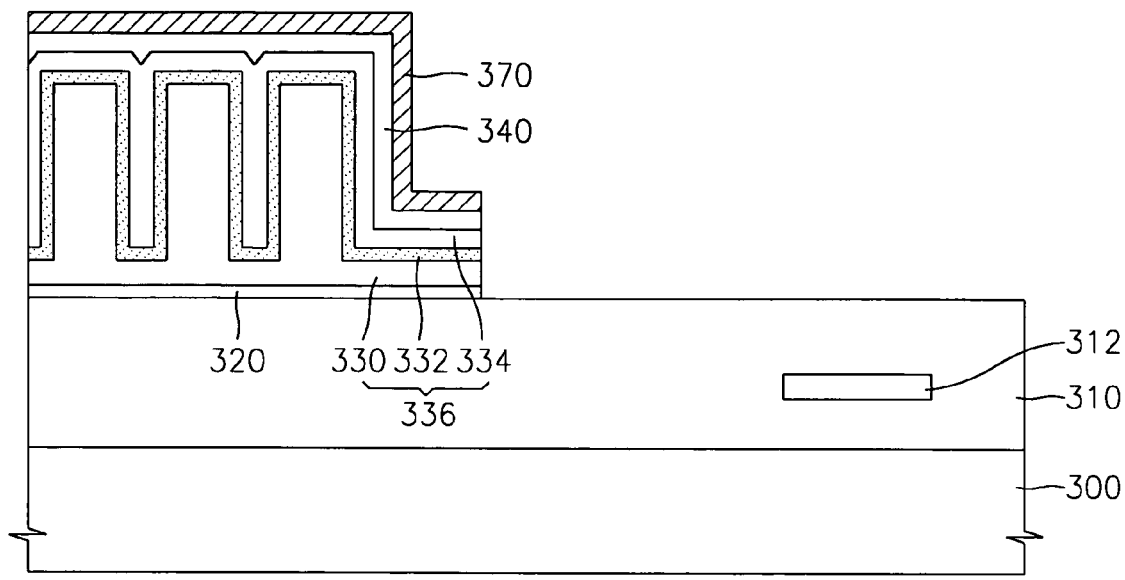
FIGS. 13 through 16 are cross-sectional views that illustrate methods of forming a stack-type capacitor of an integrated circuit device that includes a hydrogen barrier spacer according to further embodiments of the present invention.
Figure 14:
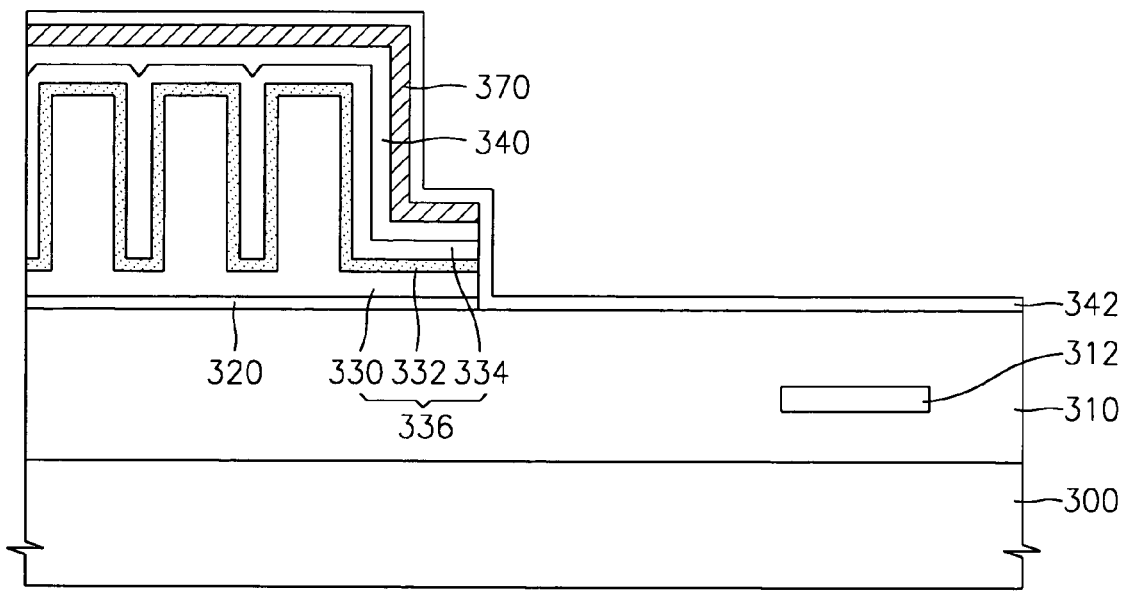
Figure 15:
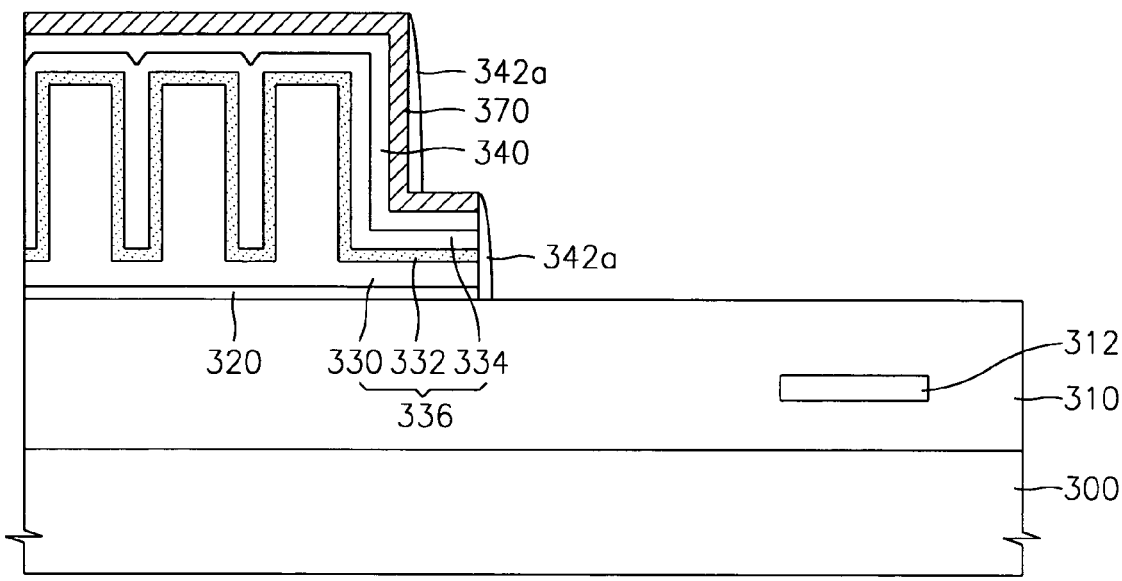
Figure 16:
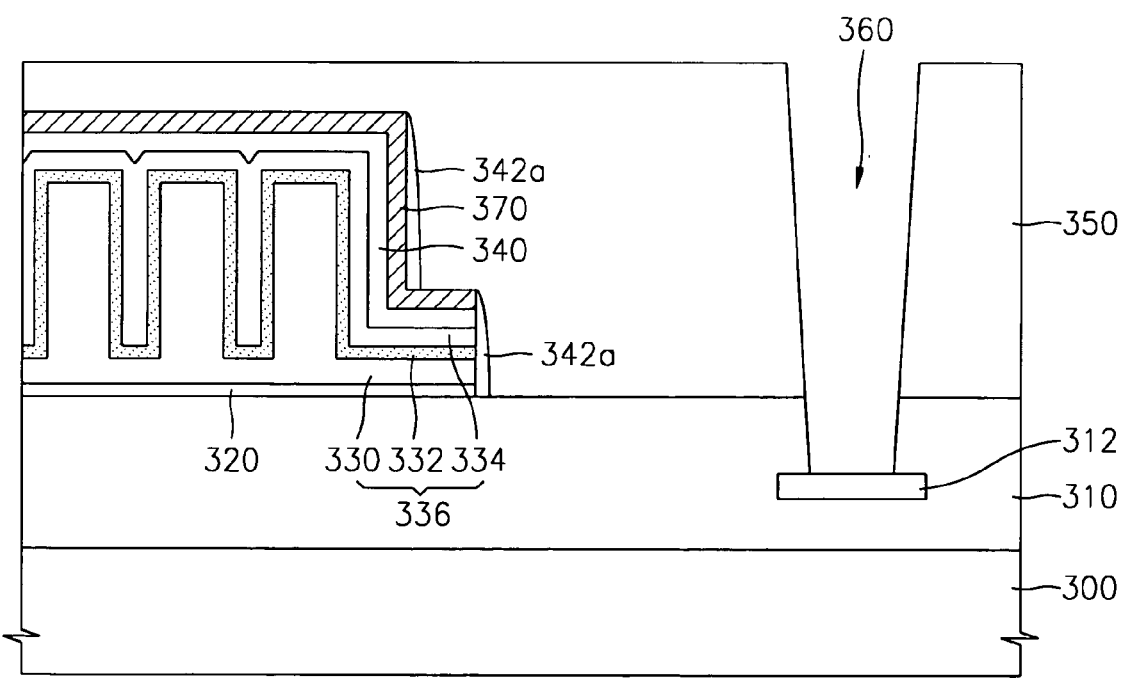
Figure 17:
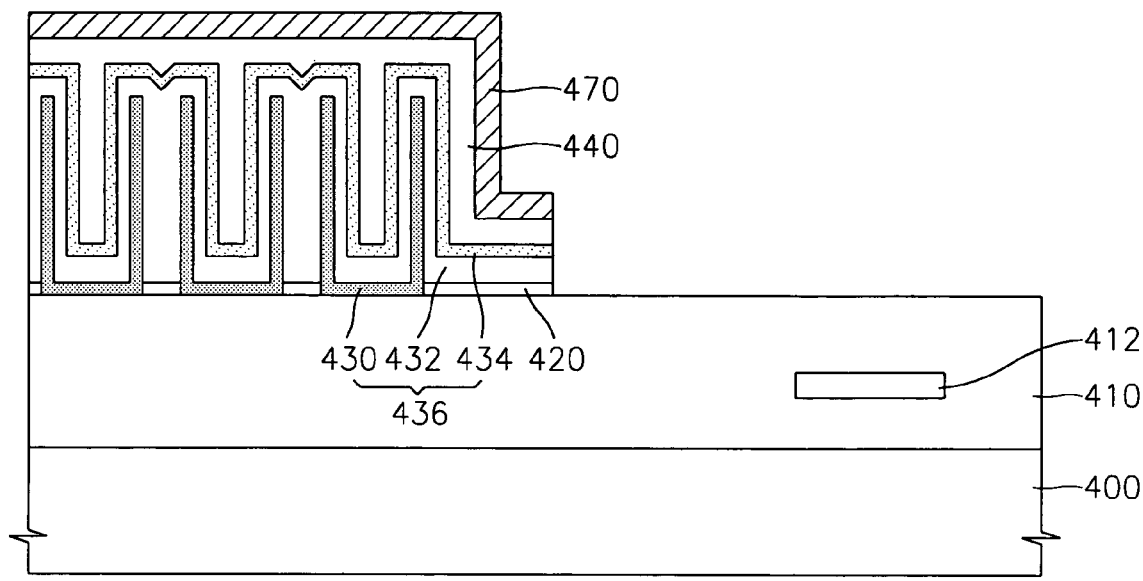
FIGS. 17 through 20 are cross-sectional views that illustrate methods of forming a cylinder-type capacitor of an integrated circuit device that includes a hydrogen barrier spacer according to further embodiments of the present invention.
Figure 18:
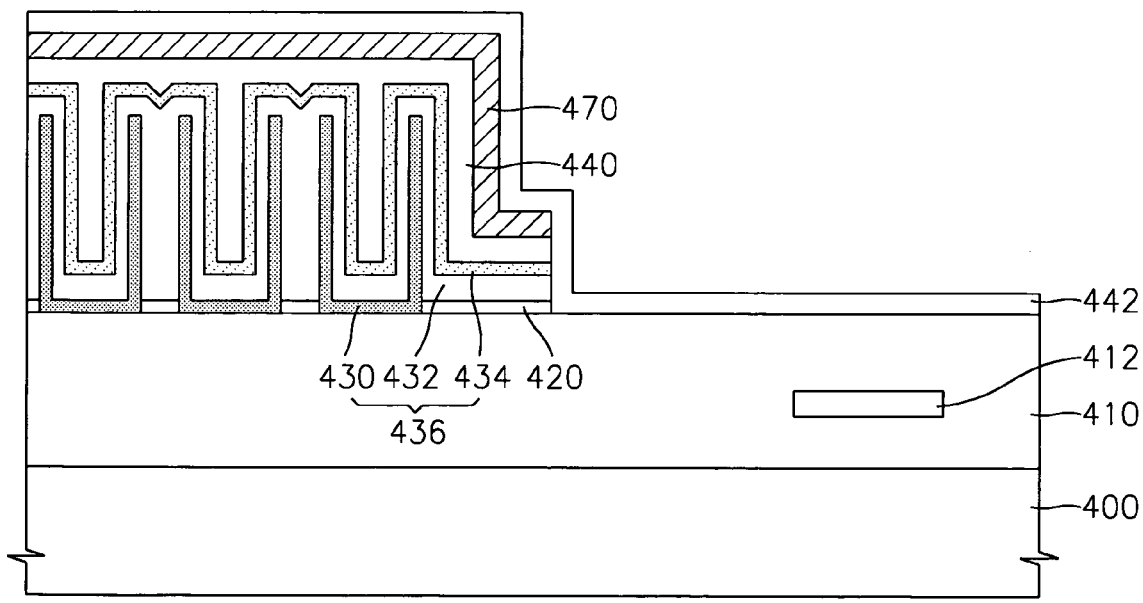
Figure 19:
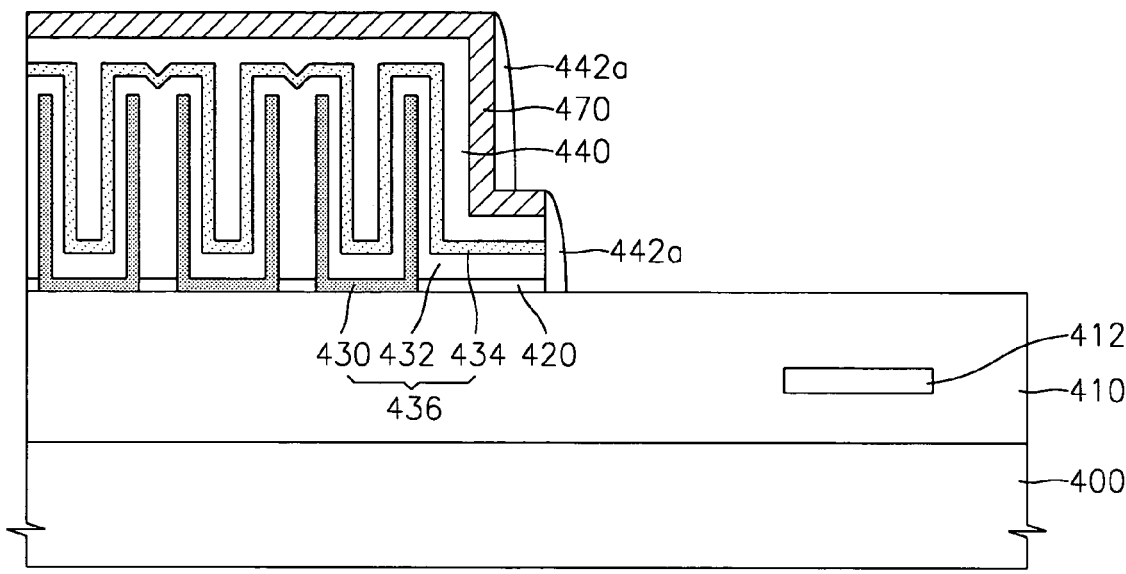
Figure 20:
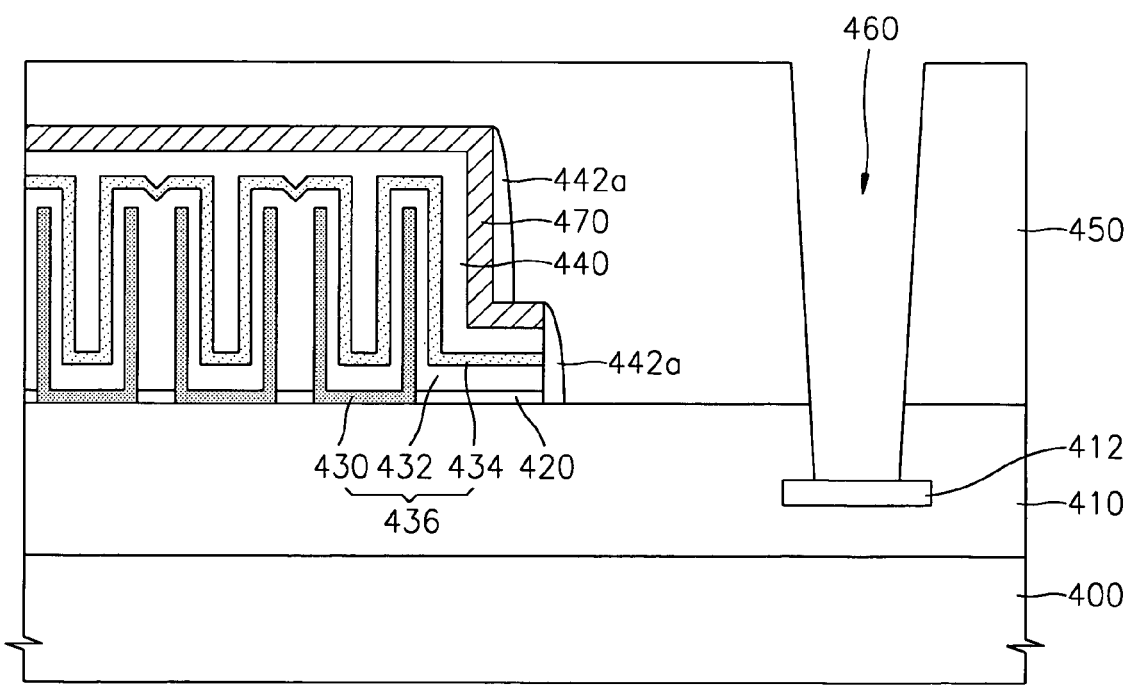

Referring now to FIGS. 13 and 17, after depositing the first hydrogen-barrier insulating layers 340 and 440, layers having an etch selectivity with respect to the first hydrogen-barrier insulating layers 340 and 440 and the second hydrogen-barrier insulating layers 342 and 442, for example, P-TEOS layers, are further deposited thereon. Thus, when the hydrogen barrier spacers 342a and 442a are subsequently etched using an anisotropic etch process, over-etching of the first hydrogen-barrier insulating layers may be prevented. Also, process simplification may be achieved.

Because the other process steps are the same as in the embodiments described above with reference to FIGS. 5 through 8 and 9 through 12, their description will be omitted for brevity.

FIGS. 21 through 24 are cross-sectional views that illustrate methods of forming a stack-type capacitor of an integrated circuit device that includes a hydrogen barrier spacer according to further embodiments of the present invention. FIGS. 25 through 28 are cross-sectional views that illustrate methods of forming a cylinder-type capacitor of an integrated circuit device that includes a hydrogen barrier spacer according to further embodiments of the present invention.

Figure 21:
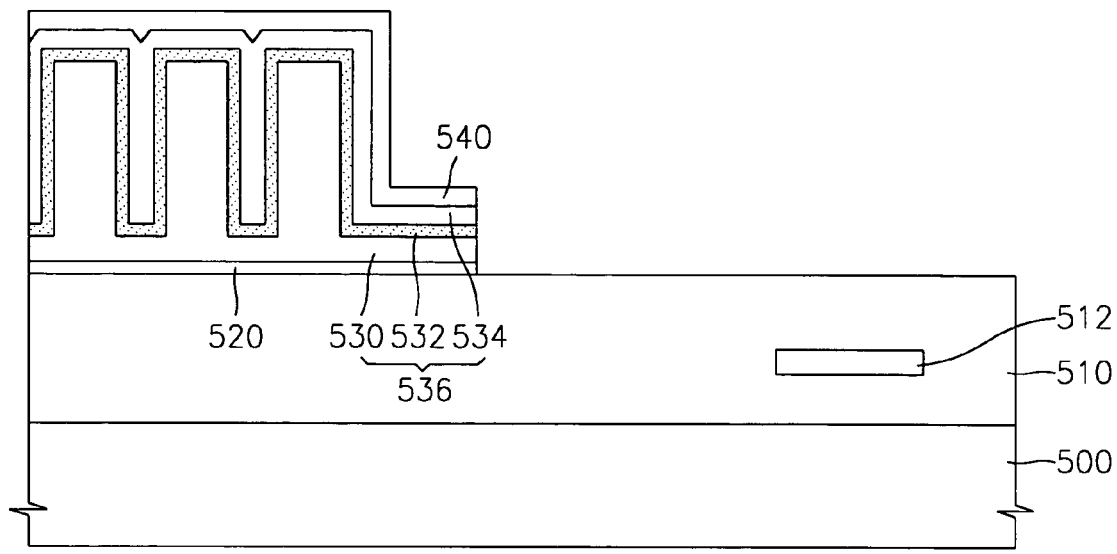
FIGS. 21 through 24 are cross-sectional views that illustrate methods of forming a stack-type capacitor of an integrated circuit device that includes a hydrogen barrier spacer according to further embodiments of the present invention.
Figure 25:
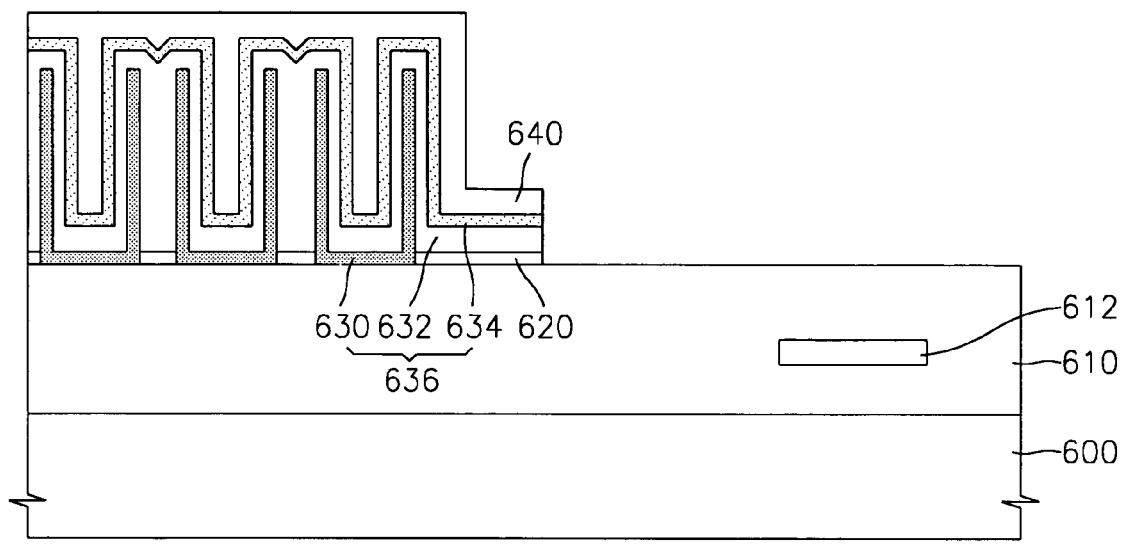
FIGS. 25 through 28 are cross-sectional views that illustrate methods of forming a cylinder-type capacitor of an integrated circuit device that includes a hydrogen barrier spacer according to further embodiments of the present invention.

Referring to FIGS. 21 and 25, transistors and bit lines 512 and 612 are formed on semiconductor substrates 500 and 600, respectively, using conventional methods. Next, first ILD layers 510 and 610 are deposited thereon and are then planarized. Etching stop layers 520 and 620 are formed on the first ILDs 510 and 610, respectively. Capacitors 536 and 636 are formed on the etching stop layers 520 and 620, respectively. First hydrogen-barrier insulating layers 540 and 640 are formed on the capacitors 536 and 636 using the same material as described above. The first hydrogen-barrier insulating layers 540 and 640 and the capacitors 536 and 636 are simultaneously etched to separate cell regions from peripheral regions.

Figure 22:
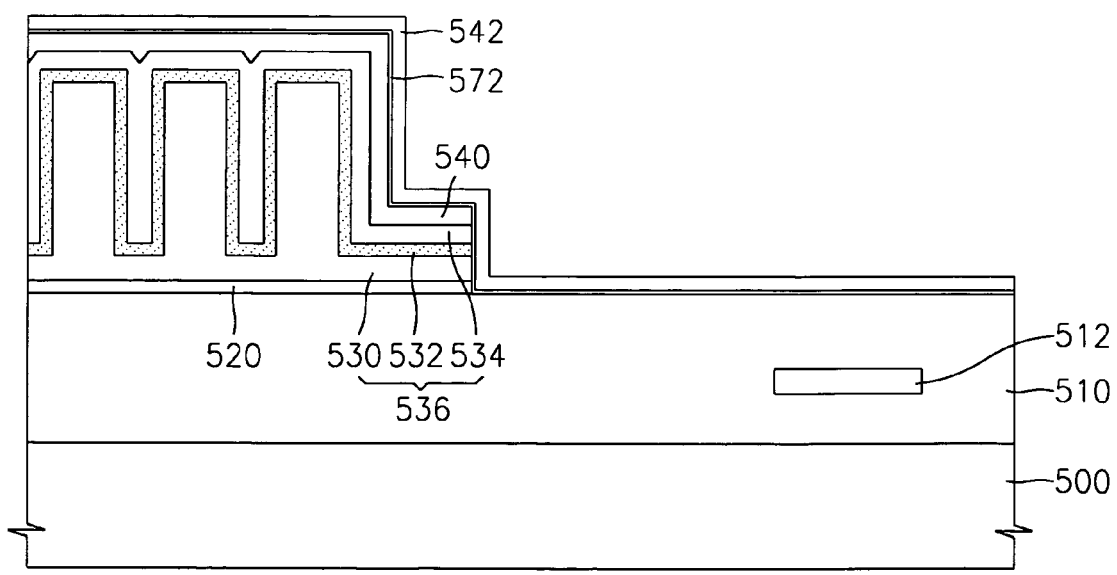
Figure 26:
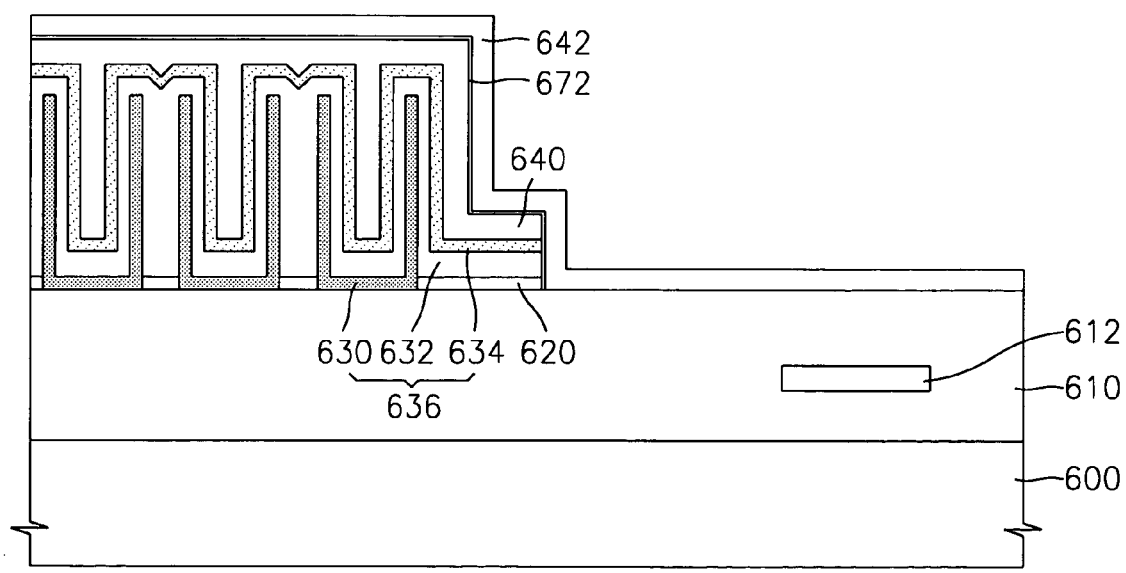

Referring to FIGS. 22 and 26, liner layers 572 and 672 are deposited to a thickness of about 50 Å to 100 Å on the surface of the semiconductor substrates where the cell regions are separated from the peripheral regions. The liner layers 572 and 672 may serve as etching stop layers when the hydrogen barrier spacers 542a and 642a are etched using an anisotropic etch process. The liner layers 572 and 672 may comprise a silicon nitride (SiN) layer, a silicon oxide ($SiO_2$) layer, a silicon carbide (SiC) layer, a tantalum oxide ($Ta_2O_5$) layer, and/or a titanium oxide ($TiO_2$) layer. Then, second hydrogen-barrier insulating layers 542 and 642 are deposited using a blanket method on the liner layers 572 and 672.

Figure 23:
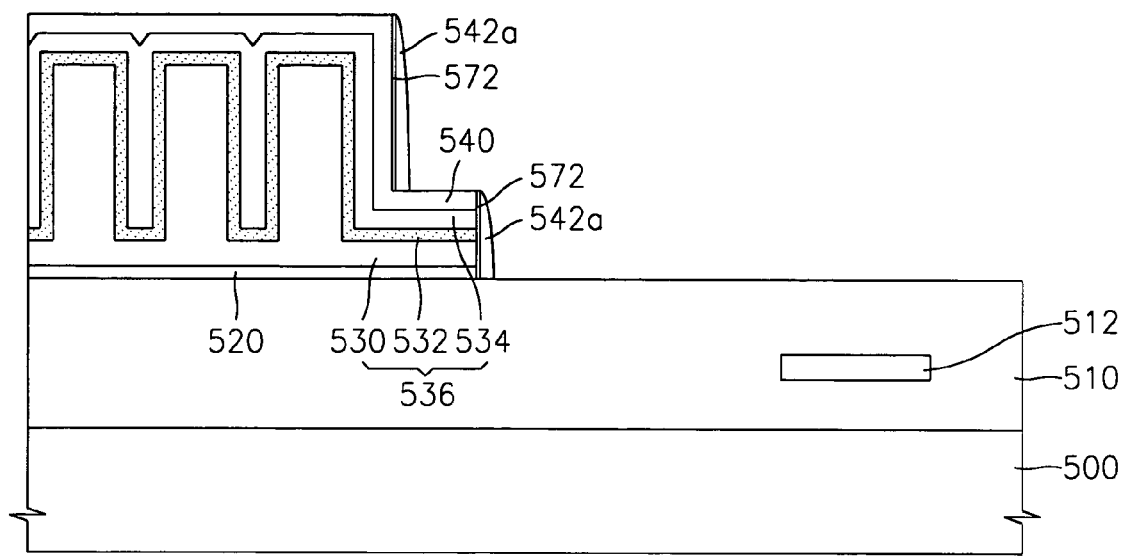
Figure 27:
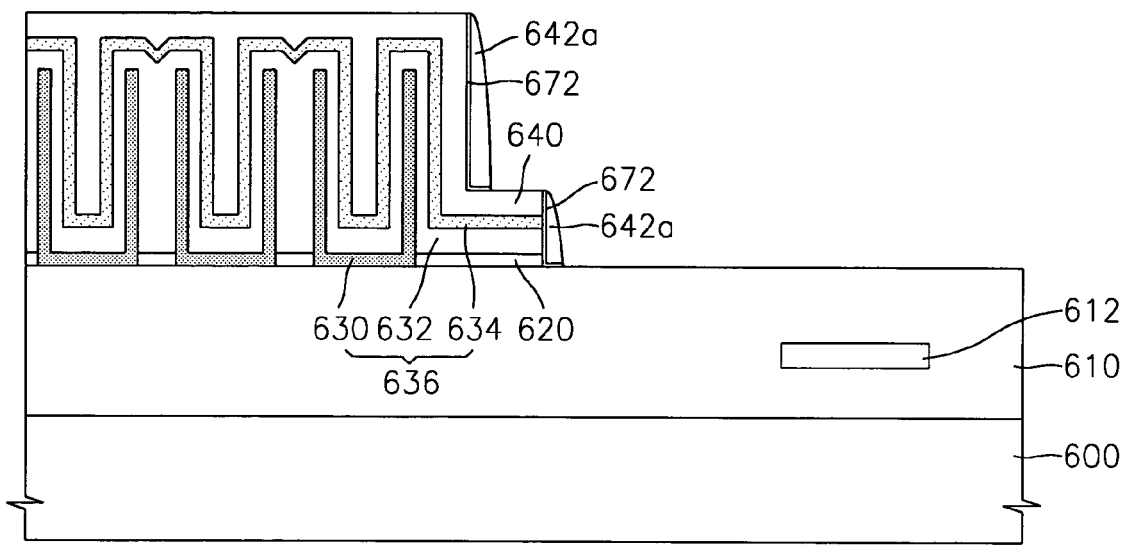

Referring to FIGS. 23 and 27, the second hydrogen-barrier insulating layers 542 and 642 are etched using an anisotropic etch process. Thus, hydrogen barrier spacers 542a and 642a are formed on portions where a step exists between the cell region and the peripheral region. That is, at sidewalls of the etched capacitors 536 and 636. Here, the liner layers 572 and 672 function as the etch stop layers in the anisotropic etching process for forming the hydrogen barrier spacers 542a and 642a. Thus, over-etching of the first hydrogen-barrier insulating layers 540 and 640 may be prevented. In this case, the liner layers 572 and 672 formed on the capacitor upper electrodes 534 and 634 are substantially removed in the anisotropic etch process. Next, a process for curing damage caused by etching, for example, a plasma process or a thermal treatment, may be carried out as described above.

Figure 24:
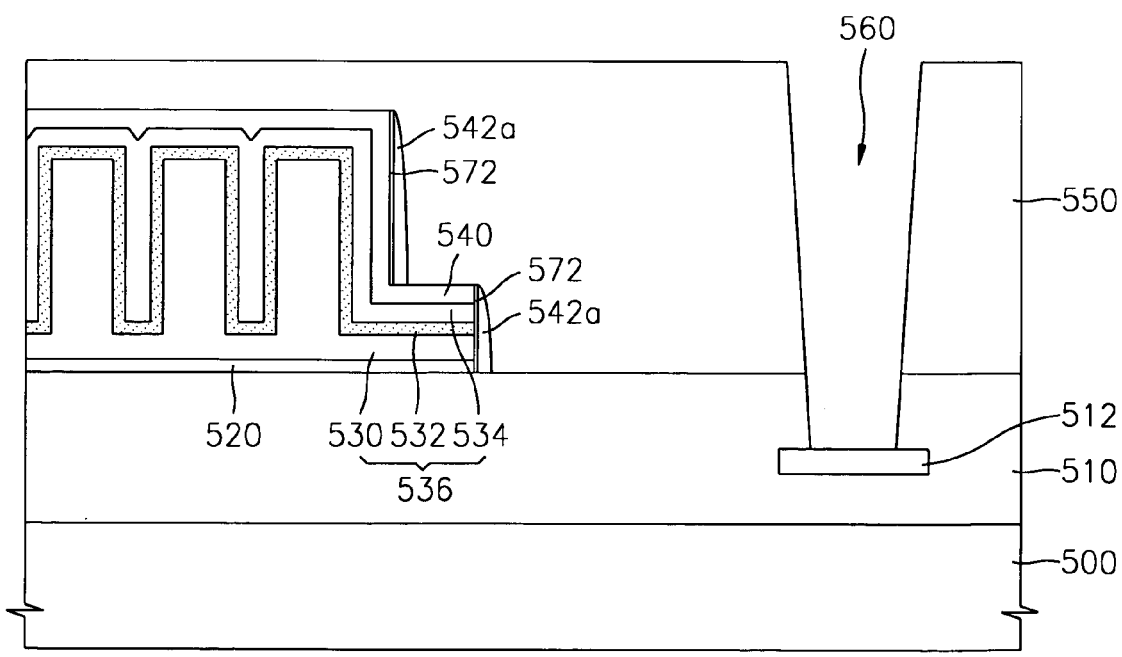
Figure 28:
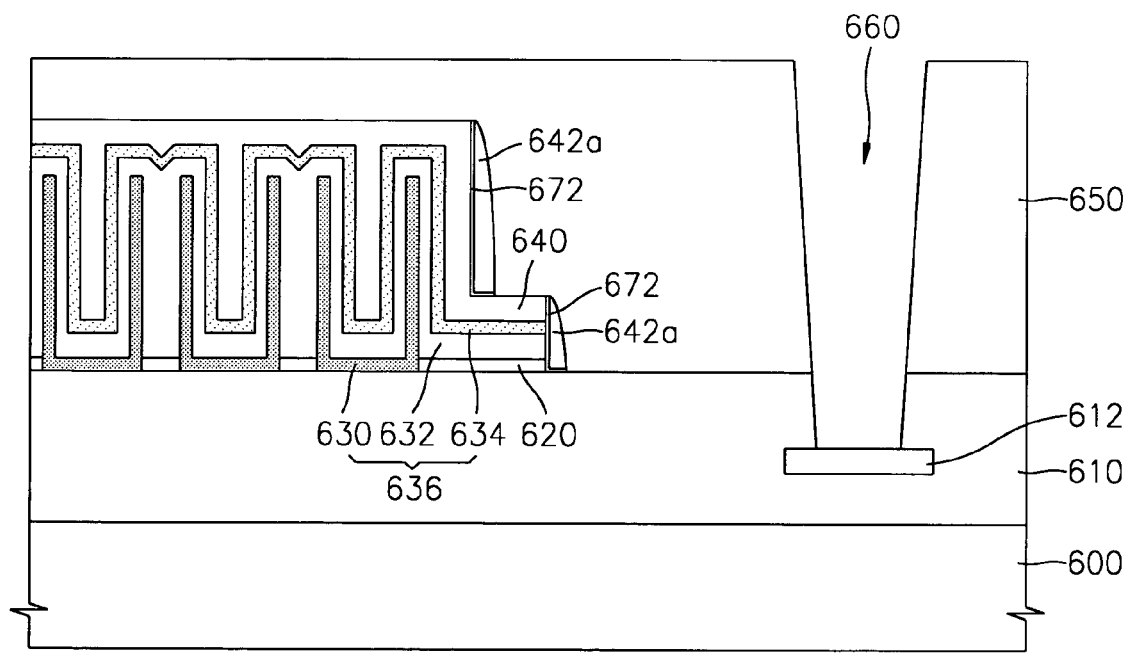

Referring to FIGS. 24 and 28, second ILD layers 550 and 650 are deposited on the semiconductor substrate where the hydrogen barrier spacers 542a and 642a are formed to remove a step between the cell region and the peripheral region. Then, photolithographic and etching processes are carried out to form metal contact holes 540 and 640. Because the first hydrogen-barrier insulating layers 540 and 640 are not formed in the peripheral region, oblique etching or incomplete etching of the metal contact holes 560 and 660 may be avoided during the etching process for forming the metal contact holes 560 and 660. As a result, when contact plugs are formed to fill the metal contact holes, a contact resistance may not increase.

Furthermore, during a subsequent hydrogen alloy process, the liner layers 572 and 672 and the spacers 542a and 642a, which comprise the same material as the second hydrogen-barrier insulating layers 542 and 642, are disposed on the sidewalls of the capacitors 536 and 636 and are etched using the same process as in the first embodiment. Accordingly, penetration of hydrogen into electrode interfaces and the dielectric layers of the capacitors 536 and 636 can be reduced. Thus, electrical properties of the capacitors 536 and 636 may be preserved.

Hereinafter, structural characteristics of a capacitor of an integrated circuit device that includes a hydrogen barrier spacer according to some embodiments of the present invention will be described with reference to FIGS. 8, 12, 16, 20, 24, and 28.

According to the present invention, a capacitor of an integrated circuit device that includes a hydrogen-barrier spacer according to some embodiments of the present invention comprises a semiconductor substrate, a lower structure formed on the semiconductor substrate, a first ILD that covers the lower structure and is planarized, a capacitor that is formed on the first ILD and in which a lower electrode and an upper electrode are formed so as to comprise a noble metal, a first hydrogen-barrier insulating layer formed on the capacitor, and a hydrogen barrier spacer that caps the top and sidewall of the capacitor. A hydrogen-barrier insulating layer, for example, an aluminum oxide layer, is limited to a cell region and does not extend into a peripheral region. The capacitor may be a stack-type capacitor or a cylinder-type capacitor.

Figure 29:
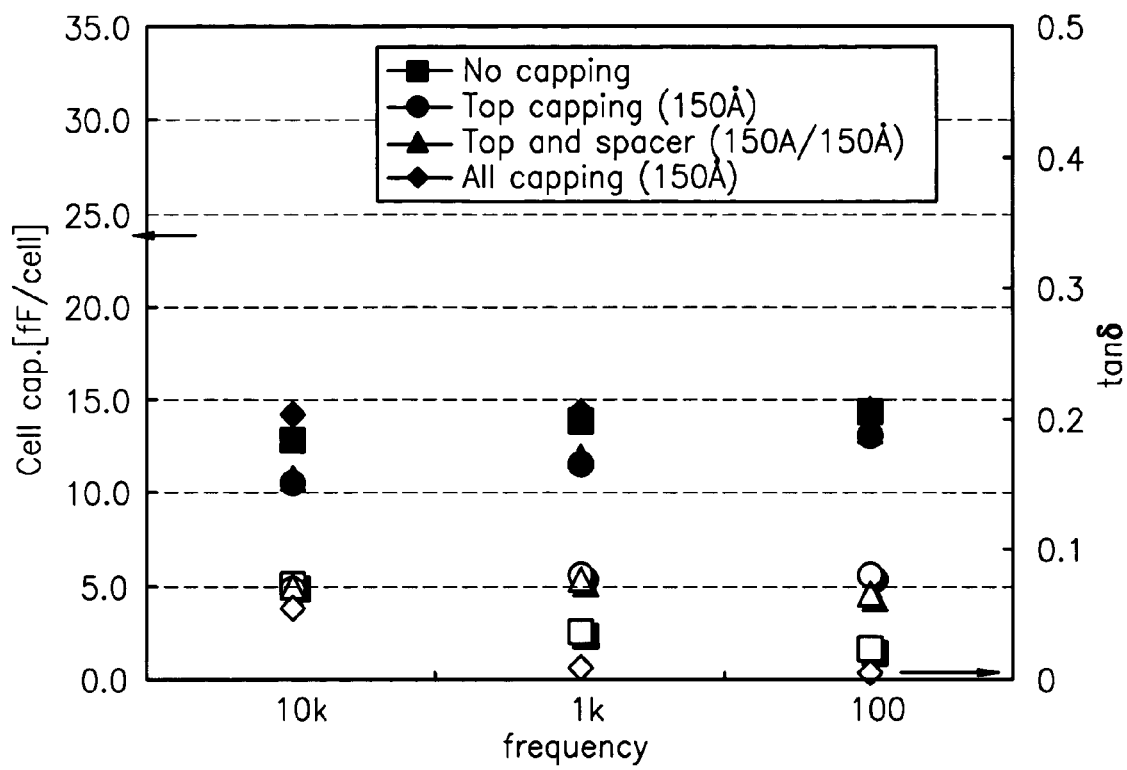
FIGS. 29 and 30 are graphs of cell capacitance versus frequency for an integrated circuit memory device after a hydrogen alloy process is performed.
Figure 30:
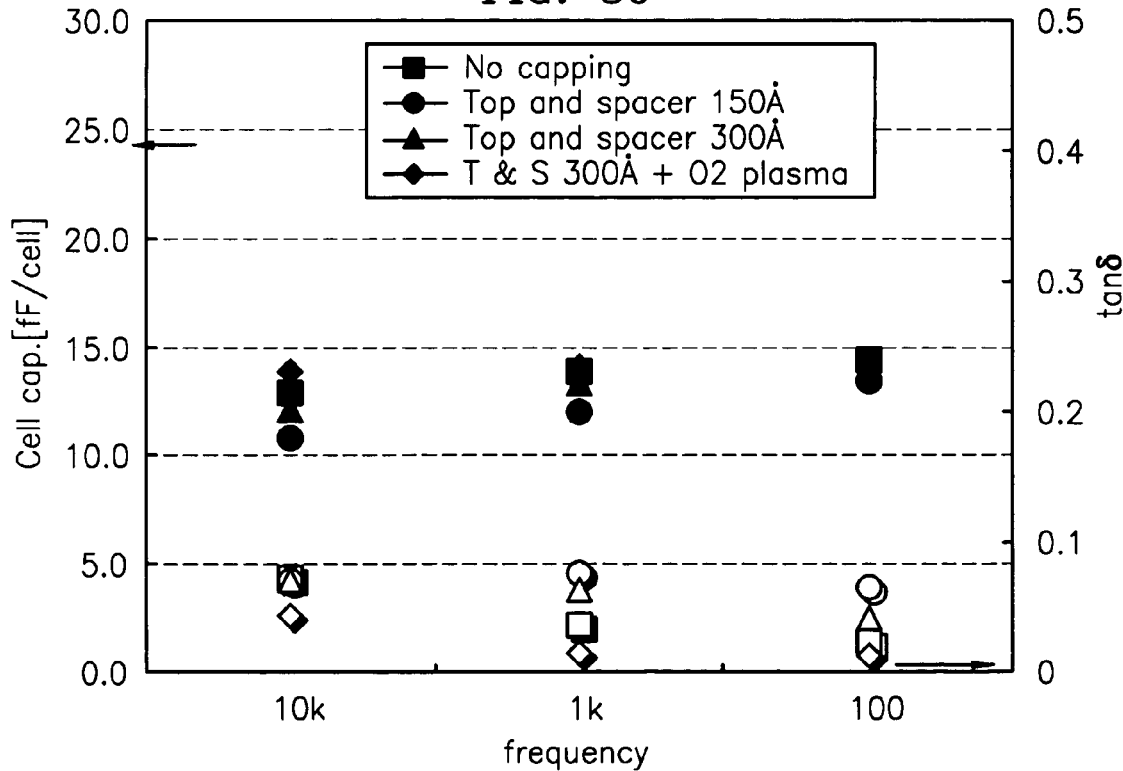

FIGS. 29 and 30 are graphs of cell capacitance versus frequency for an integrated circuit memory device after a hydrogen alloy process is performed. Referring to FIGS. 29 and 30, integrated circuit device capacitors were manufactured in accordance with the embodiments described above with respect to FIGS. 13 through 16 and FIGS. 17 through 20 and a hydrogen alloy process was performed on the sample devices. Next, cell capacitance and dielectric loss of the samples were measured. FIG. 29 shows the cell capacitance with respect to the frequency when a hydrogen-barrier insulating, layer was forming on the capacitor. In the drawings, tan δ denotes the dielectric loss In FIG. 29, ■ denotes a sample in which a hydrogen-barrier insulating layer was not formed (no capping); ● denotes a sample in which a hydrogen barrier layer was formed to a thickness of about 150 Å only on the capacitor (top capping); ▲ denotes a sample in which a hydrogen-barrier insulating layer was formed to a thickness of about 150 Å on the capacitor and a hydrogen barrier spacer was formed to a thickness of 150 Å on the sidewall of the capacitor (top and spacer); and ♦ denotes a sample in which a hydrogen-barrier insulating layer is uniformly deposited to a thickness of about 150 Å on both the top and sidewall of the capacitor (all capping).

FIG. 30 shows the cell capacitance with respect to the frequency when the thickness of a hydrogen-barrier insulating layer in the capacitor was adjusted differently, or when $O_2$-plasma processing was carried out to cure damage caused by etching. In FIG. 30, ■ denotes a sample in which a hydrogen-barrier insulating layer was not formed (no capping); ● denotes a sample in which a space-shaped hydrogen-barrier insulating layer was formed to a thickness of about 150 Å on the top and sidewall of the capacitor (top and spacer 150 Å); ▲ denotes a sample in which a hydrogen-barrier insulating layer was formed to a thickness of about 300 Å and a hydrogen barrier spacer was formed to a thickness of about 300 Å on a sidewall of the capacitor (top and spacer 300 Å); ♦ denotes a sample obtained by additionally performing $O_2$-plasma processing to the sample ▲ (all capping).

The samples ■ of FIGS. 29 and 30 and the samples ♦ of FIGS. 29 and 30 show relatively little difference in cell capacitance with respect to frequency variation. However, in the samples ● and ▲ of FIG. 29, the cell capacitance varies by about 0.5 to 1 fF/cell as the frequency is varied. Also, in the samples ■ of FIGS. 29 and 30 and the samples ♦ of FIGS. 29 and 30, the dielectric loss (tan δ) has a relatively low value showing frequency dependency. However, in the samples ● and ▼ of FIG. 29, the dielectric loss (tan δ) has a relatively high value showing no frequency dependency.

Figure 31:
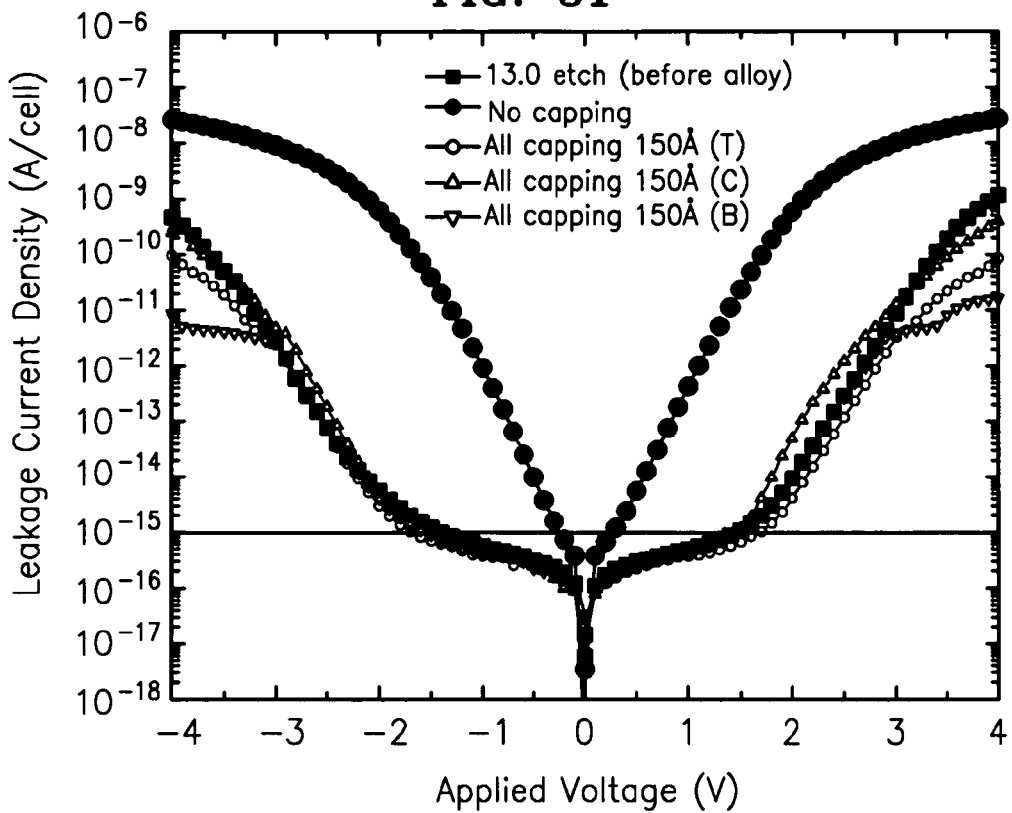
FIGS. 31 and 32 are graphs of leakage current density versus applied voltage for an integrated circuit memory device after a hydrogen alloy process is performed.
Figure 32:
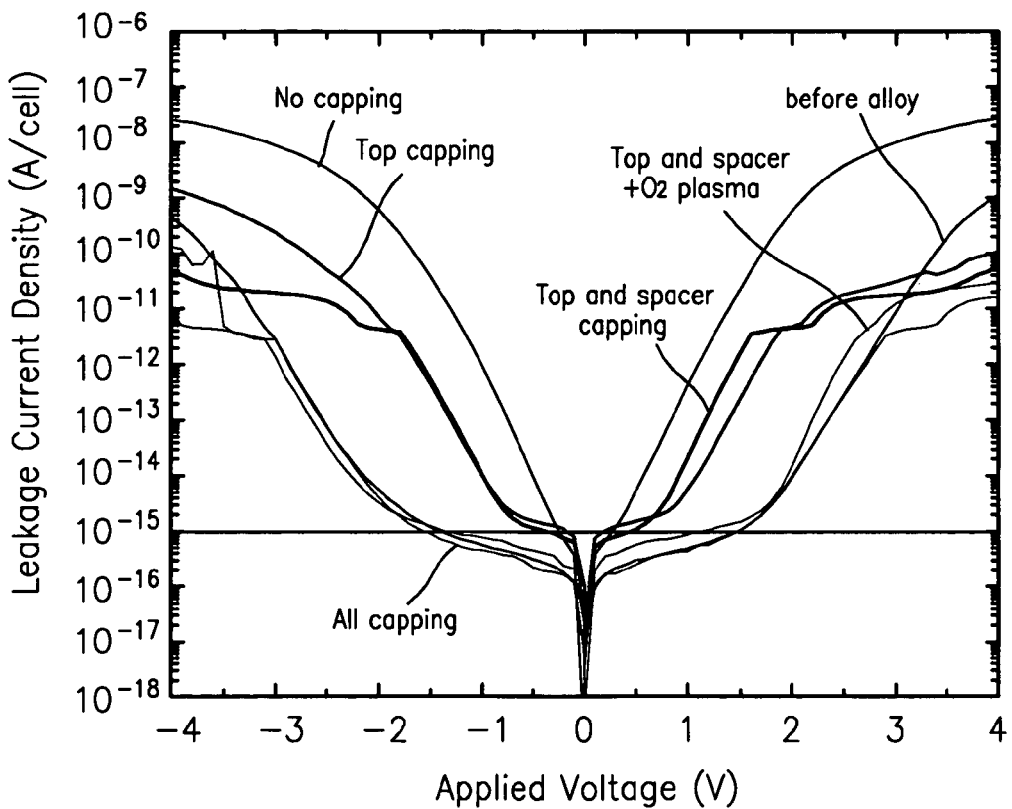

FIGS. 31 and 32 are graphs of leakage current density versus applied voltage for an integrated circuit memory device after a hydrogen alloy process is performed. Referring to FIGS. 31 and 32, integrated circuit device capacitors were manufactured in accordance with the embodiments described above with respect to FIGS. 13 through 16 and FIGS. 17 through 20 and a hydrogen alloy process was performed on the sample devices. Afterwards, the leakage current density of the samples was measured.

As shown in FIG. 31, when a hydrogen-barrier insulating layer is formed to a thickness of about 150 Å on the surface of the capacitor, a leakage current characteristic is not degraded. Samples, T, C, and B denote samples disposed on the top, in the center, and on the bottom, respectively, of a semiconductor wafer.

FIG. 32 shows leakage current characteristics depending on whether or not a hydrogen-barrier insulating layer or a spacer was formed on a capacitor. When the hydrogen-barrier insulating layer was not formed on the capacitor (no capping), the leakage current characteristic was most degraded. Next, when the hydrogen-barrier insulating layer was formed only on the capacitor (top capping) and when the hydrogen-barrier insulating layer was formed on the capacitor and the hydrogen barrier spacer was formed on the sidewall of the capacitor (top and spacer), the leakage current characteristic was improved but still degraded. That is, even if the first hydrogen-barrier insulating layer is formed on the capacitor and the hydrogen barrier spacer is formed on the sidewall of the capacitor in accordance with some embodiments of the present invention, the penetration of hydrogen may not be completely prevented.

It may be inferred, however, that the hydrogen penetration problem may result from etching damage caused during the formation of the hydrogen barrier spacer. Thus, additional processing, such as, for example, plasma processing using $O_2$, $NH_3$, and/or $N_2O$ or thermal treatment using $N_2$, $O_2$, and/or $O_3$, may be performed to cure the damage caused by etching.

Figure 33:
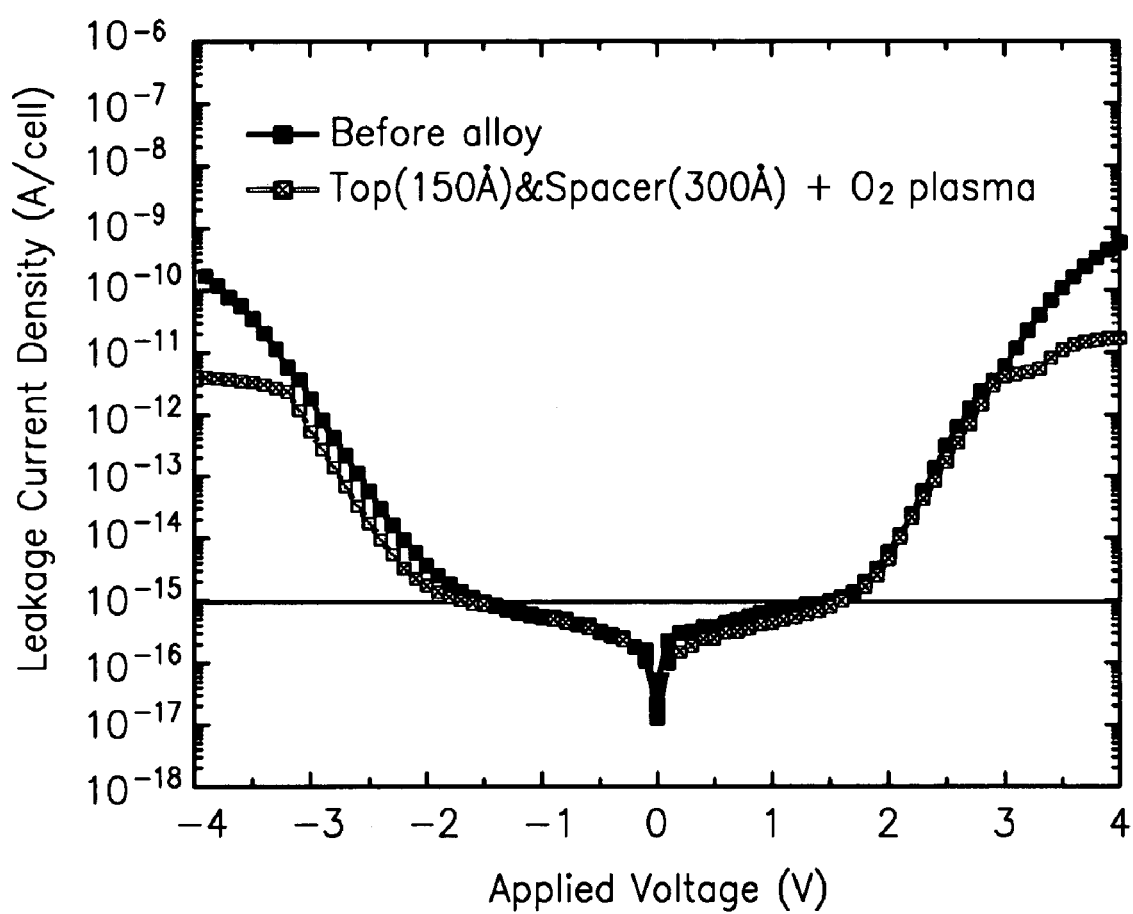
FIG. 33 is a graph showing leakage current characteristics after the etching damage caused during formation of the hydrogen barrier spacer is cured.

FIG. 33 is a graph showing leakage current characteristics after the etching damage caused during formation of the hydrogen barrier spacer is cured. Referring to FIG. 33, a first hydrogen-barrier insulating layer was formed to a thickness of about 150 Å on a capacitor, and a hydrogen barrier spacer was formed to a thickness of about 300 Å on a sidewall of the capacitor. Next, a process for curing damage caused by etching, for example, $O_2$-plasma processing, was carried out. Then, a leakage current density was measured before and after a hydrogen alloy process was performed. The graphs show that the process for curing the etching damage may inhibit the degradation of leakage current characteristics.

The $O_2$-plasma processing was carried out under the following conditions: A semiconductor manufacturing chamber was maintained at a temperature of about 300° C. to 500° C. and under a pressure of about 1 Torr to 5 Torr. A plasma power supply ranged from about 500 W to about 2000 W, and oxygen ($O_2$) was injected into the chamber at a flow rate of about 1500 sccm to about 3000 sccm. Also, the $O_2$-plasma processing was carried out for about 30 seconds to about 3 minutes.

Embodiments of the present invention may help to maintain a contact resistance at a desired level during the formation of a metal contact because a hydrogen-barrier insulating layer is not formed under a second ILD. Also, during a subsequent hydrogen alloy process, a hydrogen barrier spacer covers a sidewall of a capacitor so as to inhibit penetration of hydrogen into the sidewall of the capacitor. As a result, electrical characteristics of electrodes and a dielectric layer of the capacitor may be maintained so as not to increase a leakage current.

Further, because formation of a hydrogen barrier spacer may be followed by a curing process, after performing a hydrogen alloy process, variations in cell capacitance, dielectric loss, and/or the increase in leakage current may be avoided.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of forming an integrated circuit device, comprising:
    providing a substrate;
    forming a capacitor on the substrate, the capacitor comprising a lower electrode on the substrate, a dielectric layer on the lower electrode, and an upper electrode on the dielectric;
    forming a first hydrogen barrier insulation layer on the upper electrode and on the substrate;
    forming an etch stop layer on the first hydrogen barrier insulation layer;
    etching the etch stop layer and the first hydrogen barrier insulation layer so as to substantially remove the etch stop layer and the hydrogen barrier insulation layer from the substrate;
    forming a second hydrogen barrier insulation layer on the etch stop layer and on the substrate; and
    etching the second hydrogen barrier insulation layer so as to form a hydrogen barrier spacer on a sidewall of the capacitor.

2. The method of claim 1, wherein forming the hydrogen barrier insulation layer comprises:
    forming the hydrogen barrier insulation layer on the upper electrode and on the substrate; and
    etching the hydrogen barrier insulation layer so as to substantially remove the hydrogen barrier insulation layer from the substrate.

3. The method of claim 2, wherein the hydrogen barrier insulation layer is a first hydrogen barrier insulation layer and wherein forming the hydrogen barrier spacer comprises:
    forming a second hydrogen barrier insulation layer on the first hydrogen barrier insulation layer and on the substrate; and
    etching the second hydrogen barrier insulation layer so as to form the hydrogen barrier spacer on the sidewall of the capacitor.

4. The method of claim 3, wherein the first hydrogen barrier insulation layer comprises aluminum oxide, titanium oxide, tantalum oxide, titanium nitride, silicon oxide, and/or silicon without impurities.

5. The method of claim 3, wherein the second hydrogen barrier insulation layer comprises aluminum oxide, titanium oxide, tantalum oxide, titanium nitride, silicon oxide, and/or silicon without impurities.

6. The method of claim 3, wherein the first hydrogen barrier insulation layer has a thickness of about 200–1000 Å.

7. The method of claim 3, wherein the second hydrogen barrier insulation layer has a thickness of about 100–500 Å.

8. The method of claim 3, wherein the first and second hydrogen barrier insulation layers are formed using one of atomic layer deposition (ALD) and chemical vapor deposition (CVD).

9. The method of claim 1, wherein the etch stop layer comprises a P-TEOS layer.

10. The method of claim 1, wherein the capacitor is a stack-type capacitor.

11. The method of claim 1, wherein the capacitor is a cylinder-type capacitor.

12. A method of forming an integrated circuit device, comprising:
    providing a substrate;
    forming a capacitor on the substrate, the capacitor comprising a lower electrode on the substrate, a dielectric layer on the lower electrode, and an upper electrode on the dielectric;
    forming the hydrogen barrier insulation layer on the upper electrode and on the substrate;
    etching the hydrogen barrier insulation layer so as to substantially remove the hydrogen barrier insulation layer from the substrate;
    forming a liner layer on the first hydrogen barrier insulation layer and on the substrate;
    forming a second hydrogen barrier insulation layer on the liner layer; and
    etching the second hydrogen barrier insulation layer and the liner layer so as to form a hydrogen barrier spacer on the sidewall of the capacitor, the hydrogen barrier spacer comprising a second hydrogen barrier insulation layer spacer on a liner layer spacer.

13. The method of claim 12, wherein the liner layer comprises silicon nitride, silicon oxide, silicon carbide, tantalum oxide, and/or titanium oxide.

14. The method of claim 12, wherein the liner layer is formed to a thickness of about 50–100 Å.

15. The method of claim 12, wherein the capacitor is a stack-type capacitor.

16. The method of claim 12, wherein the capacitor is a cylinder-type capacitor.

17. An integrated circuit device, comprising:
    a substrate;
    a capacitor on the substrate, the capacitor comprising a lower electrode on the substrate, a dielectric layer on the lower electrode, and an upper electrode on the dielectric;
    a hydrogen barrier insulation layer on the upper electrode;
    an etch stop layer on the hydrogen barrier insulation layer; and
    a hydrogen barrier spacer on a sidewall of the capacitor.

18. The device of claim 17, wherein the hydrogen barrier insulation layer comprises aluminum oxide, titanium oxide, tantalum oxide, titanium nitride, silicon oxide, and/or silicon without impurities.

19. The device of claim 17, wherein the hydrogen barrier spacer comprises aluminum oxide, titanium oxide, tantalum oxide, titanium nitride, silicon oxide, and/or silicon without impurities.

20. The device of claim 17, wherein the hydrogen barrier insulation layer has a thickness of about 200–1000 Å.

21. The device of claim 17, wherein the etch stop layer comprises a P-TEOS layer.

22. An integrated circuit device, comprising:
    a substrate;
    a capacitor on the substrate, the capacitor comprising a lower electrode on the substrate, a dielectric layer on the lower electrode, and an upper electrode on the dielectric;
    a first hydrogen barrier insulation layer on the upper electrode; and
    a hydrogen barrier spacer on a sidewall of the capacitor, comprising:
        a liner layer; and
        a second hydrogen barrier layer on the liner layer.

23. The device of claim 22, wherein the liner layer comprises silicon nitride, silicon oxide, silicon carbide, tantalum oxide, and/or titanium oxide.

24. The device of claim 22, wherein the liner layer has a thickness of about 50–100 Å.

25. A method of manufacturing a capacitor of a semiconductor device including a hydrogen barrier spacer, the method comprising:
   forming a lower structure including a transistor and a bit line on a semiconductor substrate;
   depositing a first interlayer dielectric on the lower structure;
   planarizing the first interlayer dielectric;
   forming a capacitor on the first interlayer dielectric;
   forming a hydrogen barrier spacer to cover a sidewall of an upper electrode, a dielectric layer, and a lower electrode of the capacitor;
   curing etching damage caused during the formation of the hydrogen barrier spacer;
   depositing a second interlayer dielectric on the surface of the semiconductor substrate where the hydrogen barrier spacer is formed;
   planarizing the second interlayer dielectric; and
   forming a metal contact in the second interlayer dielectric;
   wherein forming the hydrogen barrier spacer comprises:
   depositing a first hydrogen-barrier insulating layer on the semiconductor substrate where the capacitor upper electrode is formed;
   forming a layer having an etch selectivity with respect to the first hydrogen barrier layer;
   etching the first hydrogen-barrier insulating layer, the upper electrode, the dielectric layer, and the lower electrode;
   depositing a second hydrogen-barrier insulating layer on the semiconductor substrate where the etching process is completed; and
   etching the second hydrogen-barrier insulating layer using an anisotropic etch process to form the hydrogen barrier spacer on a sidewall of the upper electrode, the dielectric layer, and the lower electrode of the capacitor while leaving at least a portion of the layer having the etch selectivity on the first hydrogen-barrier insulating layer.

26. The method of claim 25, wherein the semiconductor device is a dynamic random access memory.

27. The method of claim 25, wherein the semiconductor device is a ferroelectric random access memory.

28. The method of claim 25, further comprising forming an etching stopper on the first interlayer dielectric.

29. The method of claim 25, wherein the upper electrode comprises ruthenium, iridium, platinum, rhodium, and/or osmium.

30. The method of claim 25, wherein the lower electrode comprises ruthenium, iridium, platinum, rhodium, and/or osmium.

31. The method of claim 25, further comprising performing a hydrogen thermal treatment after the metal contact is formed.

32. The method of claim 25, wherein the hydrogen barrier spacer comprises aluminum oxide.

33. The method of claim 25, wherein the hydrogen barrier spacer comprises titanium oxide, tantalum oxide, titanium nitride, silicon oxide, and/or silicon without impurities.

34. The method of claim 25, wherein the capacitor is a stack-type capacitor.

35. The method of claim 25, wherein the capacitor is a cylinder-type capacitor.

36. The method of claim 25, wherein the first hydrogen-barrier insulating layer comprises aluminum oxide.

37. The method of claim 25, wherein the second hydrogen-barrier insulating layer comprises aluminum oxide.

38. The method of claim 25, wherein the first hydrogen-barrier insulating layer is formed to a thickness of about 200 Å to 1000 Å.

39. The method of claim 25, wherein the second hydrogen-barrier insulating layer is formed to a thickness of about 100 Å to 500 Å.

40. The method of claim 25, wherein the layer having an etch selectivity with respect to the first hydrogen-barrier layer is a P-TEOS layer.

41. The method of claim 25, wherein the anisotropic etching process for forming the hydrogen barrier spacer is performed so as to leave the first hydrogen-barrier insulating layer at a thickness of at least 100 Å on the capacitor upper electrode.

42. The method of claim 25, wherein curing etching damage caused during the formation of the hydrogen barrier spacer comprises plasma processing using $O_2$, $NH_3$, Ar, $N_2$, and/or $N_2O$.

43. The method of claim 42, wherein the plasma processing comprises plasma processing using $O_2$ at a temperature of about 300° C. to 500° C. at a pressure of about 1 Torr to 5 Torr, a plasma power supply range of about 500 W to 2000 W, a flow rate of about 1500 sccm to 3000 sccm, and a processing time of about 30 seconds to 3 minutes.

44. The method of claim 25, wherein curing etching damage caused during the formation of the hydrogen barrier spacer comprises thermal processing using $O_2$, $N_2$, $N_2O$, and/or $O_3$.

45. A method of manufacturing a capacitor of a semiconductor device including a hydrogen barrier spacer, the method comprising:
   forming a lower structure including a transistor and a bit line on a semiconductor substrate;
   depositing a first interlayer dielectric on the lower structure;
   planarizing the first interlayer dielectric;
   forming a capacitor on the first interlayer dielectric;
   forming a hydrogen barrier spacer to cover a sidewall of an upper electrode, a dielectric layer, and a lower electrode of the capacitor;
   curing etching damage caused during the formation of the hydrogen barrier spacer;
   depositing a second interlayer dielectric on the surface of the semiconductor substrate where the hydrogen barrier spacer is formed;
   planarizing the second interlayer dielectric; and
   forming a metal contact in the second interlayer dielectric;
   wherein forming the hydrogen barrier spacer comprises:
   depositing a first hydrogen-barrier insulating layer on the semiconductor substrate where the capacitor upper electrode is formed;
   etching the first hydrogen-barrier insulating layer, the upper electrode, the dielectric layer, and the lower electrode;
   forming an etch-stop liner layer on the semiconductor substrate where the etching process is completed;
   depositing a second hydrogen-barrier insulating layer on the etch-stop liner layer; and
   etching the second hydrogen-barrier insulating layer using an anisotropic etch process to form the hydrogen barrier spacer on a sidewall of the capacitor upper electrode, the dielectric layer, and the lower electrode.

46. The method of claim 45, wherein the first hydrogen-barrier insulating layer comprises aluminum oxide.

47. The method of claim 45, wherein the second hydrogen-barrier insulating layer comprises aluminum oxide.

48. The method of claim 45, wherein the etch-stop liner layer comprises a SiN layer, a $SiO_2$ layer, a SiC layer, a $Ta_2O_5$ layer, and/or a $TiO_2$ layer.

49. The method of claim 45, wherein the first hydrogen-barrier layer and the second hydrogen-barrier each have a thickness of about 100 Å to 500 Å.

50. The method of claim 45, wherein the etch-stop liner layer has a thickness of about 50 Å to 100 Å.

51. The method of claim 45, wherein the anisotropic etching process for forming the hydrogen barrier spacer is performed using a dry etch process.

52. The method of claim 45, wherein the anisotropic etch process for forming the hydrogen barrier spacer is performed so as to leave the first hydrogen-barrier insulating layer at a thickness of at least 150 Å on the capacitor upper electrode.

53. A capacitor of a semiconductor device, comprising:
a semiconductor substrate;
a lower structure that defines a device isolation region on the semiconductor substrate and includes a transistor and a bit line;
a first interlayer dielectric (ILD) that covers the lower structure and where a planarization process is completed;
a capacitor formed on the first interlayer dielectric;
a hydrogen barrier spacer covering a sidewall of an upper electrode, a dielectric layer, and a lower electrode of the capacitor;
a first hydrogen-barrier insulating layer disposed on the upper electrode; and
a P-TEOS layer disposed on the first hydrogen-barrier insulating layer.

54. The capacitor of claim 53, further comprising an etch stop layer between the first interlayer dielectric and the capacitor.

55. The capacitor of claim 53, wherein the capacitor is a cylinder-type capacitor.

56. The capacitor of claim 53, wherein the capacitor is a stack-type capacitor.

57. The capacitor of claim 53, wherein the upper electrode and the lower electrode comprise ruthenium, iridium, platinum, rhodium, and/or osmium.

58. The capacitor of claim 53, wherein the hydrogen barrier spacer comprises $Al_2O_3$.

59. The capacitor of claim 53, wherein the hydrogen barrier spacer comprises $TiO_2$, $Ta_2O_5$, TiN, $SiO_2$, and/or silicon without impurities.

60. A capacitor of a semiconductor device, comprising:
a semiconductor substrate;
a lower structure that defines a device isolation region on the semiconductor substrate and includes a transistor and a bit line;
a first interlayer dielectric (ILD) that covers the lower structure and where a planarization process is completed;
a capacitor formed on the first interlayer dielectric; and
a hydrogen barrier spacer covering a sidewall of an upper electrode, a dielectric layer, and a lower electrode of the capacitor;
a first hydrogen-barrier insulating layer disposed on the upper electrode; and
a liner layer disposed between sidewalls of the upper electrode, the dielectric layer, and the lower electrode of the capacitor and the hydrogen barrier spacer.

61. The capacitor of claim 60, wherein the liner layer comprises a SiN layer, a $SiO_2$ layer, a SiC layer, a $Ta_2O_5$ layer, and/or a $TiO_2$ layer.

62. The capacitor of claim 60, wherein the liner layer has a thickness of about 50 Å to 100 Å.

63. The capacitor of claim 53, wherein the hydrogen barrier spacer is disposed directly on the exposed sidewall of the capacitor.

* * * * *